United States Patent
Liu et al.

(10) Patent No.: US 11,894,408 B2
(45) Date of Patent: *Feb. 6, 2024

(54) DUAL FACING BSI IMAGE SENSORS WITH WAFER LEVEL STACKING

(71) Applicant: Taiwan Semiconductor Manufacturing Company, Ltd., Hsinchu (TW)

(72) Inventors: Ping-Yin Liu, Yonghe (TW); Yeur-Luen Tu, Taichung (TW); Chia-Shiung Tsai, Hsin-Chu (TW); Xiaomeng Chen, Hsinchu (TW); Pin-Nan Tseng, Hsin-Chu (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 234 days.

This patent is subject to a terminal disclaimer.

(21) Appl. No.: 17/347,001

(22) Filed: Jun. 14, 2021

(65) Prior Publication Data

US 2021/0305292 A1    Sep. 30, 2021

Related U.S. Application Data

(60) Continuation of application No. 16/658,355, filed on Oct. 21, 2019, now Pat. No. 11,037,978, which is a
(Continued)

(51) Int. Cl.
  *H01L 27/146* (2006.01)
(52) U.S. Cl.
  CPC .... *H01L 27/1464* (2013.01); *H01L 27/14618* (2013.01); *H01L 27/14625* (2013.01);
(Continued)

(58) Field of Classification Search
  CPC ... H01L 27/14; H01L 27/146; H01L 27/1464; H01L 27/14618; H01L 27/14625; H01L 27/14636; H01L 27/14687
(Continued)

(56) References Cited

U.S. PATENT DOCUMENTS 8,497,536 B2   7/2013   Chen et al.
8,541,878 B2   9/2013   Takahashi et al.
(Continued)

FOREIGN PATENT DOCUMENTS

CN   102177585   9/2011
CN   102201418   9/2011
(Continued)

OTHER PUBLICATIONS

Korean Office Action dated Jan. 4, 2016, Application No. 10-2014-0130157, 16 pages.

*Primary Examiner* — Fazli Erdem
(74) *Attorney, Agent, or Firm* — HAYNES AND BOONE, LLP

(57) ABSTRACT

A device includes two BSI image sensor elements and a third element. The third element is bonded in between the two BSI image sensor elements using element level stacking methods. Each of the BSI image sensor elements includes a substrate and a metal stack disposed over a first side of the substrate. The substrate of the BSI image sensor element includes a photodiode region for accumulating an image charge in response to radiation incident upon a second side of the substrate. The third element also includes a substrate and a metal stack disposed over a first side of the substrate. The metal stacks of the two BSI image sensor elements and the third element are electrically coupled.

20 Claims, 21 Drawing Sheets

Related U.S. Application Data continuation of application No. 15/651,402, filed on Jul. 17, 2017, now Pat. No. 10,453,889, which is a division of application No. 14/039,640, filed on Sep. 27, 2013, now Pat. No. 9,711,555.

(52) U.S. Cl.
CPC .. *H01L 27/14636* (2013.01); *H01L 27/14687* (2013.01); *H01L 2924/0002* (2013.01)

(58) Field of Classification Search
USPC .......................................................... 257/459
See application file for complete search history.

(56) References Cited

U.S. PATENT DOCUMENTS

| | | |
|---|---|---|
| 8,900,912 B2 | 12/2014 | Chen et al. |
| 11,037,978 B2 * | 6/2021 | Liu .................... H01L 27/14636 |
| 2010/0157117 A1 | 6/2010 | Wang |
| 2011/0233702 A1 | 9/2011 | Takahashi et al. |
| 2013/0032389 A1 | 2/2013 | Tokura et al. |
| 2013/0069188 A1 | 3/2013 | Chen et al. |
| 2013/0075607 A1 | 3/2013 | Bikumandla et al. |
| 2014/0042298 A1 | 2/2014 | Wan et al. |
| 2014/0042299 A1 | 2/2014 | Wan et al. |
| 2014/0138521 A1 | 5/2014 | Liu et al. |
| 2015/0091124 A1 | 4/2015 | Liu et al. |
| 2017/0317118 A1 | 11/2017 | Liu et al. |
| 2020/0052014 A1 | 2/2020 | Liu et al. |

FOREIGN PATENT DOCUMENTS

| | | |
|---|---|---|
| CN | 103066081 | 4/2013 |
| JP | 2011226817 | 11/2011 |
| KR | UPAP 2011-226817 | 11/2011 |
| WO | WO2010/044826 | 4/2010 |

* cited by examiner

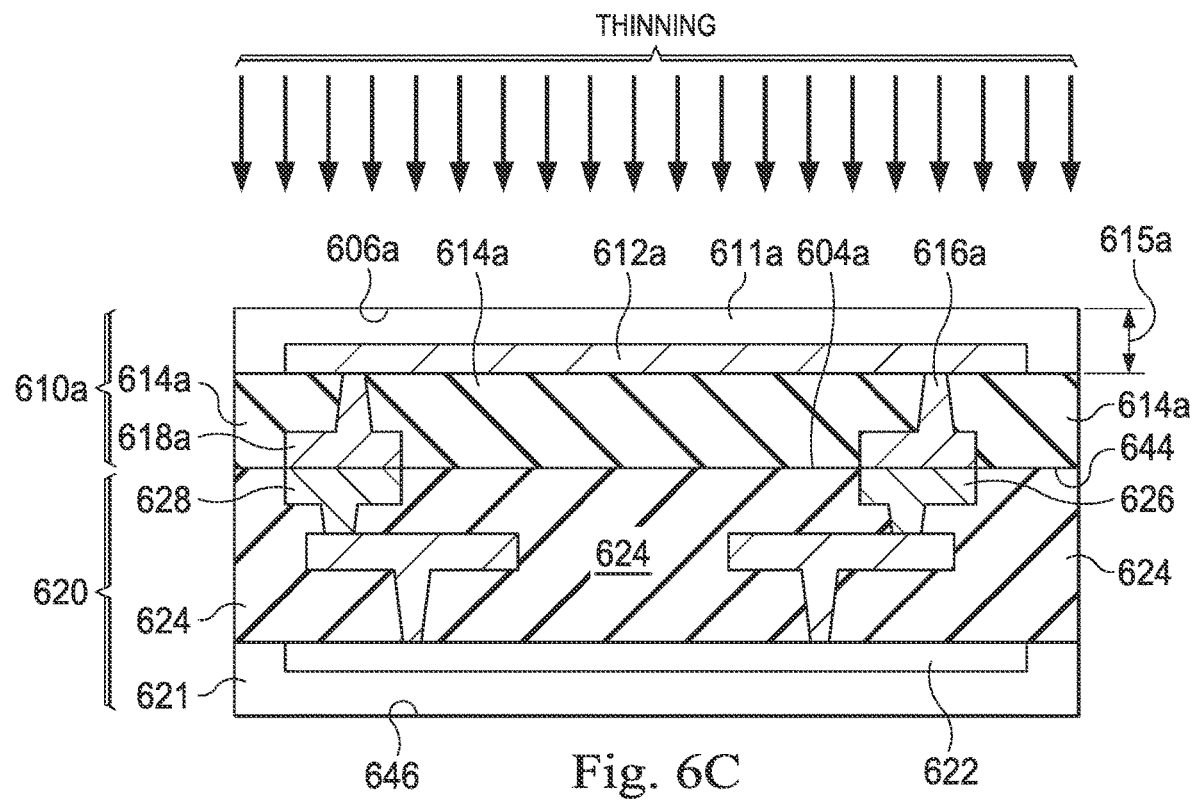
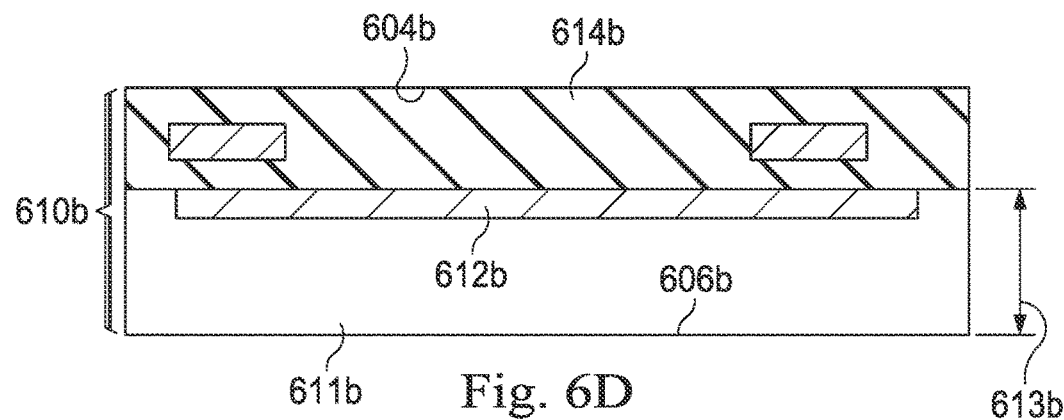

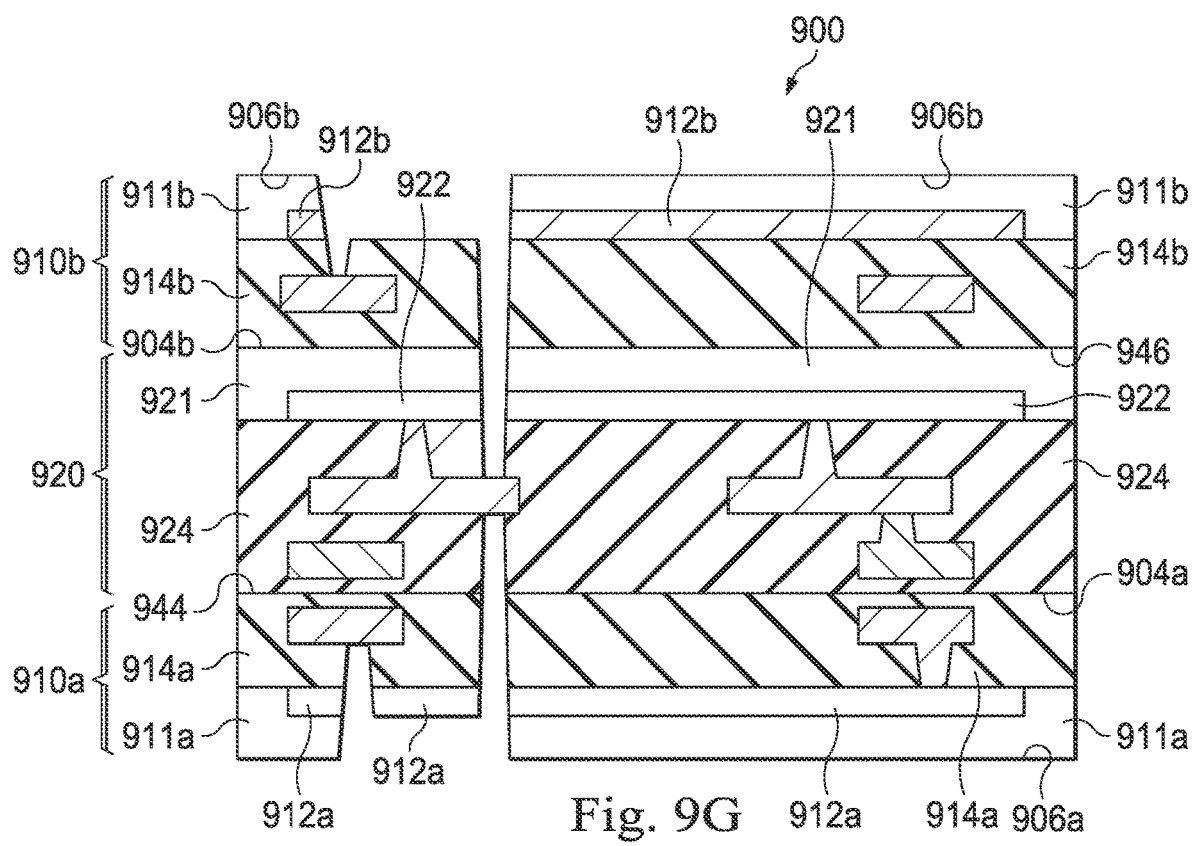
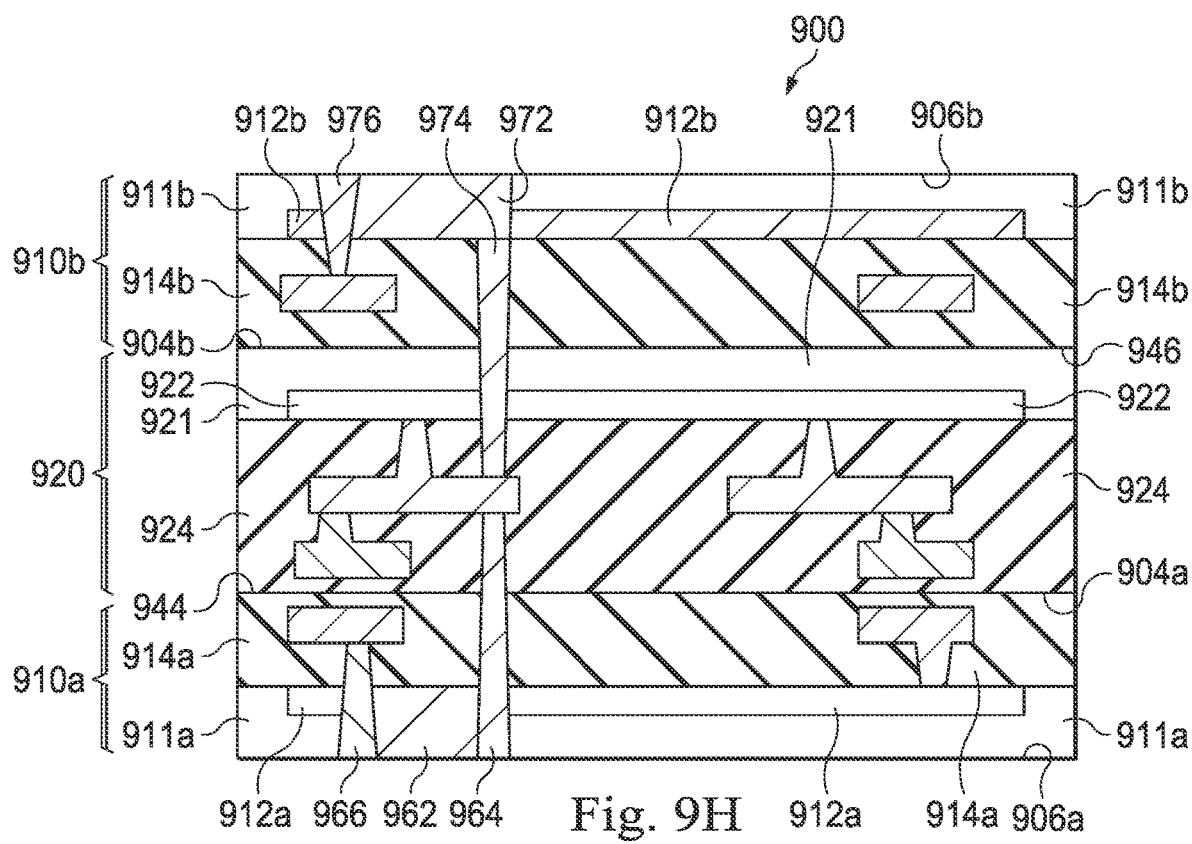

DUAL FACING BSI IMAGE SENSORS WITH WAFER LEVEL STACKING

PRIORITY DATA

The present application is a continuation application of U.S. patent application Ser. No. 16/658,355, filed Oct. 21, 2019, which is continuation application of U.S. patent application Ser. No. 15/651,402, filed Jul. 17, 2017, which is a divisional application of U.S. patent application Ser. No. 14/039,640, filed Sep. 27, 2013, each of which is hereby incorporated by reference in its entirety.

BACKGROUND

It is an ongoing trend that mobile electronic devices offer image capture capability. Some mobile electronic devices, such as a cellular phone, can capture images from both a front and a back side of the device. Many solutions exist for such dual facing camera capability. Solutions typically use two image sensors on opposing sides of the device.

Image sensors are integrated circuits (ICs) used to detect and measure radiation, such as light, received by the sensor device. A front-side illuminated (FSI) image sensor typically has pixel circuitry and metal stacks disposed on a front side of a substrate where a photosensitive or photodiode ("PD") region resides. To form an image in the PD region, the radiation passes the metal stacks. A backside-illuminated (BSI) image sensor, on the other hand, is typically formed on a thin substrate that allows the radiation to reach the PD region by passing through the substrate. A BSI image sensor offers many advantages over an FSI image sensor, such as shorter optical paths, higher quantum efficiency (QE), higher image resolution, smaller die sizes, etc.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 6A-6H are cross sectional views of forming an integrated camera module with dual-facing BSI image sensors according to the method of FIG. 5, in accordance with an embodiment.

FIGS. 9A-9H are cross sectional views of forming an integrated camera module with dual-facing BSI image sensors according to the method of FIG. 8, in accordance with an embodiment.

DETAILED DESCRIPTION

Figure 1:
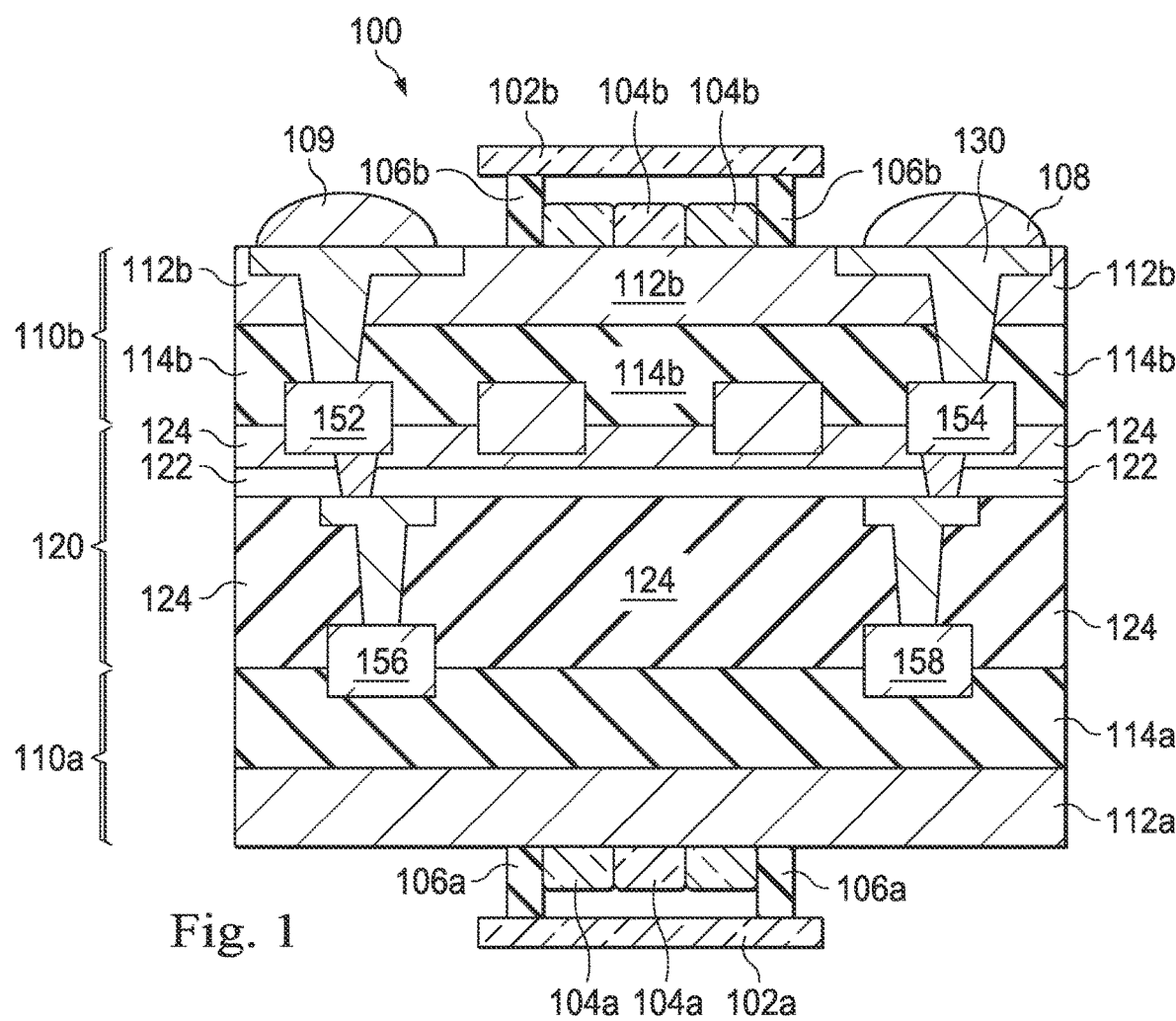
FIG. 1 illustrates an embodiment of an integrated camera module with dual-facing BSI image sensors.

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

Various embodiments of the present disclosure relate generally to integration of two BSI image sensor wafers with a processor wafer to form a dual facing camera module using wafer level stacking methods. However, specific embodiments are provided as examples to teach the broader inventive concept, and one of ordinary skill in the art can easily apply the teaching of the present disclosure to other methods or device.

FIG. 1 illustrates an integrated camera module 100 according to various aspects of the present disclosure. The camera module 100 includes a processor 120 bonded in between two BSI image sensors, 110*a* and 110*b*. The processor 120 includes an active layer 122 which includes active circuit components such as transistors, and a metal stack 124 which includes interconnect structures for communicating within the processor 120 as well as communicating between the processor 120 and the BSI image sensors 110a and 110b. The BSI image sensors 110a, 110b are similar in that they each include a PD layer 112a, 112b on its back side and a metal stack 114a, 114b on its front side. In this embodiment, the processor 120 contacts the BSI image sensors 110a and 110b through conductive features, 152, 154, 156 and 158, at their bonding surfaces. The camera module 100 also includes color filter and lens modules, 104a and 104b, disposed over the back side of the respective BSI image sensors for collecting and filtering light. The camera module 100 further includes cover glass elements, 102a and 102b, and dam elements 106a and 106b, disposed over the color filter and lens modules 104a and 104b. The camera module 100 further includes bump elements 108 and 109 for providing further integration of the camera module 100 to a substrate (not shown). With such configuration as shown in FIG. 1, the camera module 100 is able to capture radiation, such as light, incident upon both sides (dual-facing).

Figure 2:
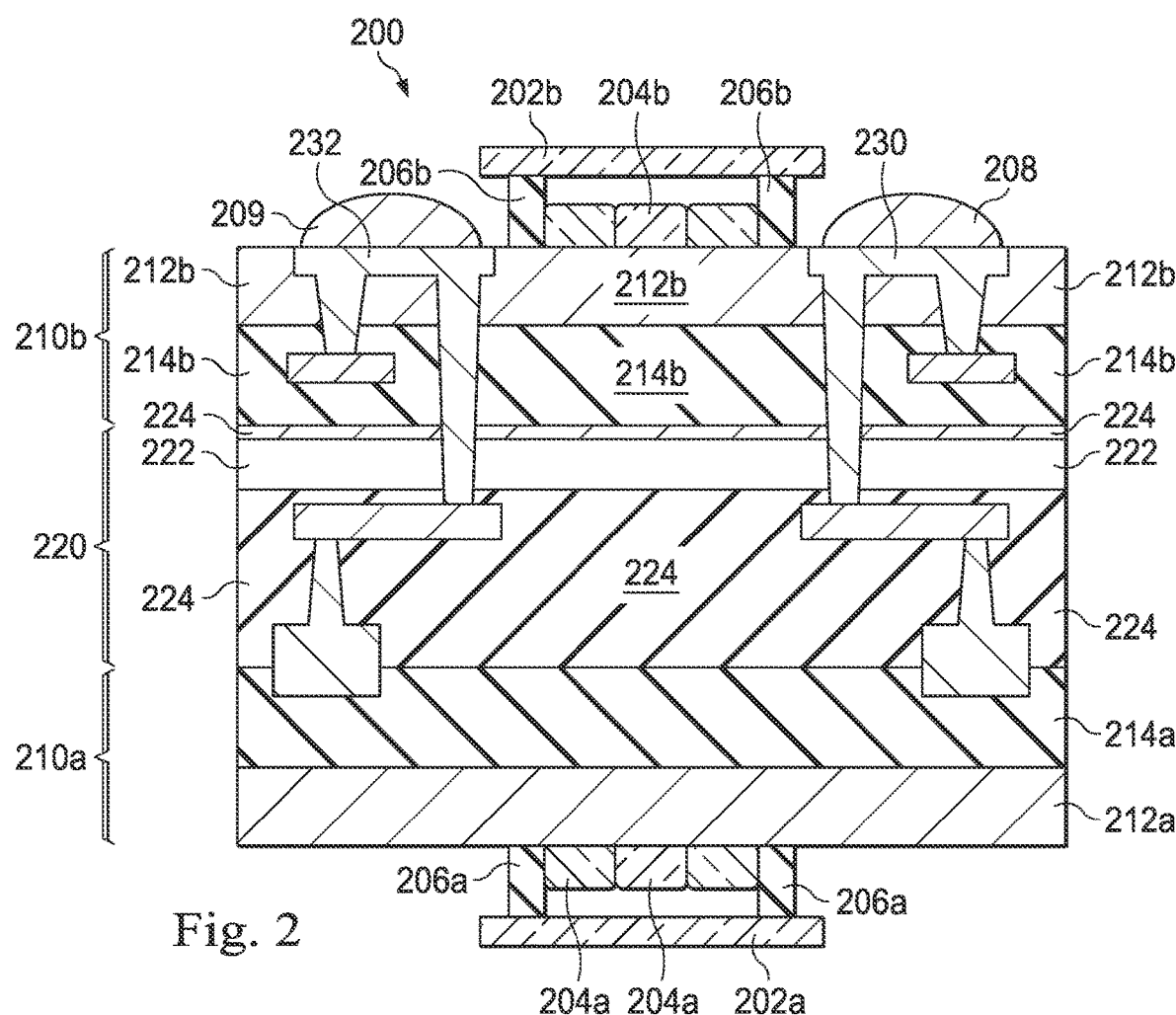
FIG. 2 illustrates another embodiment of an integrated camera module with dual-facing BSI image sensors.

FIG. 2 illustrates another integrated camera module 200 according to various aspects of the present disclosure. The camera module 200 includes substantially the same elements as the camera module 100, with a processor 220 bonded in between two BSI image sensors, 210a and 210b. In the camera module 200, bump elements 208 and 209 are electrically coupled to the processor 220 using thru-silicon vias (TSVs), 230 and 232 (FIG. 2), while the bump elements 108 and 109 of the camera module 100 are electrically coupled to the processor 120 through the conductive features 154 and 152 at the bonding surfaces of the processor 120 and the BSI image sensor 110b (FIG. 1).

Figure 3:
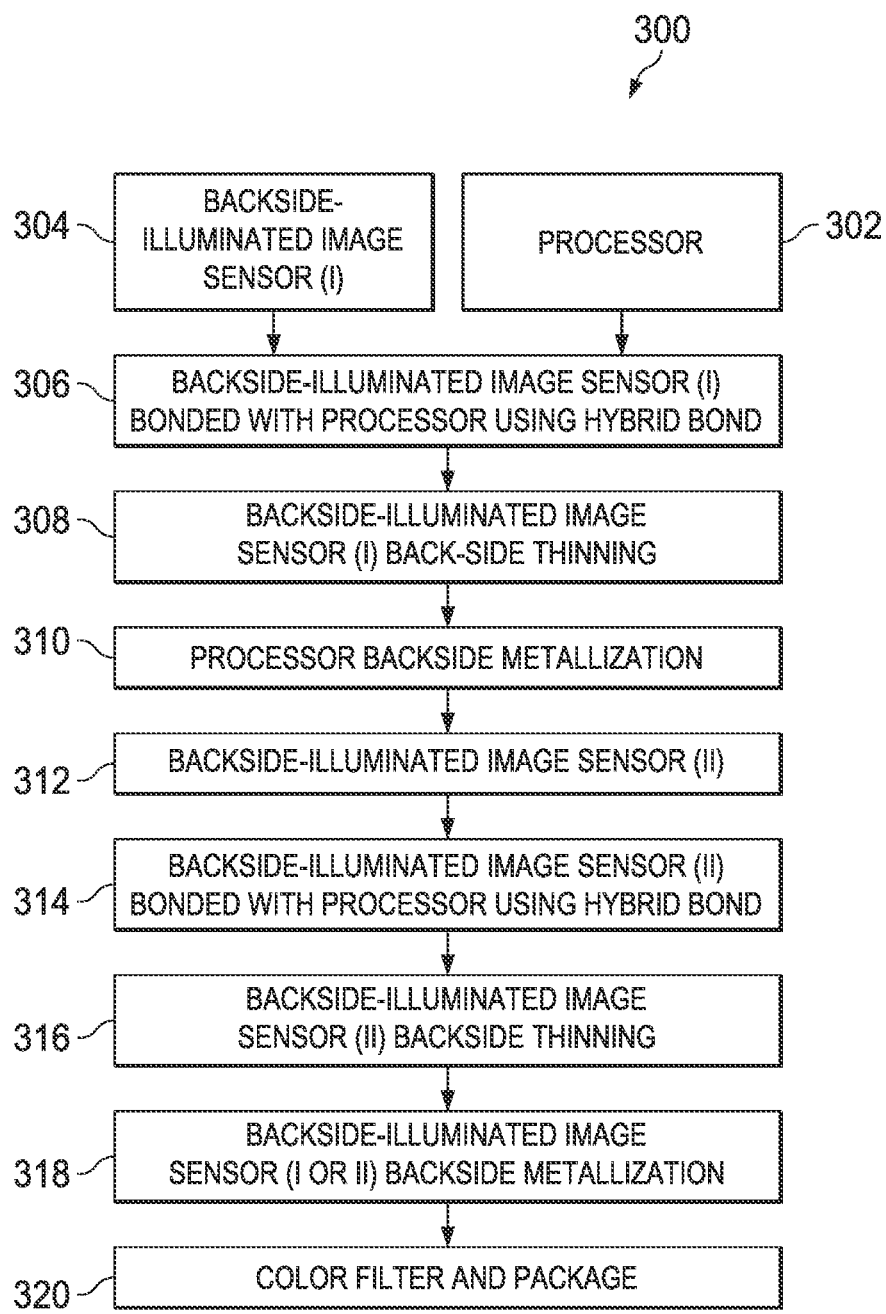
FIG. 3 is a flow chart for fabricating an integrated camera module with dual-facing BSI image sensors such as shown in FIG. 1, in accordance with an embodiment.

FIG. 3 illustrates a process flow 300 for fabricating an integrated camera module with dual-facing BSI image sensors, such as the camera module 100 (FIG. 1), according to various aspects of the present disclosure. FIG. 3 is best understood in conjunction with FIGS. 4A-4H.

Figure 4A:
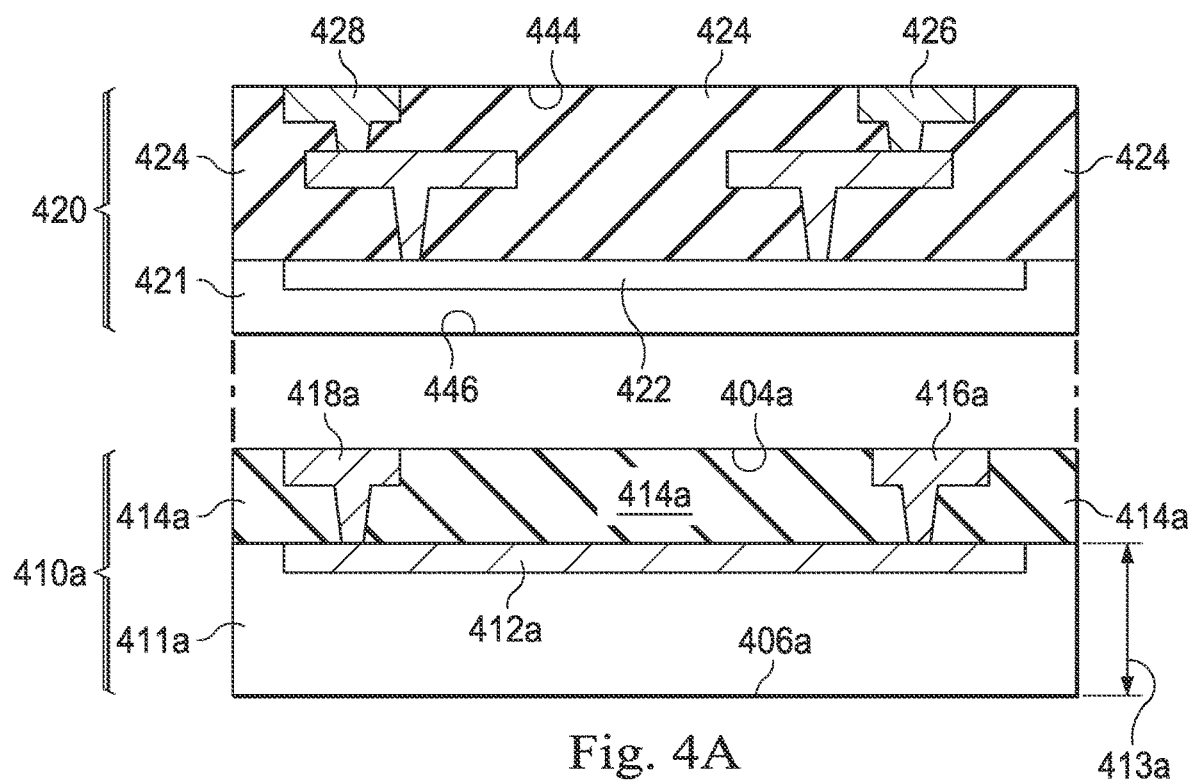
FIGS. 4A-4H are cross sectional views of forming an integrated camera module with dual-facing BSI image sensors according to the method of FIG. 3, in accordance with an embodiment.

The process flow 300 (FIG. 3) receives a processor wafer (operation 302) and a first BSI image sensor wafer (operation 304). Referring to FIG. 4A, an exemplar processor wafer 420 includes a substrate 421 and a metal stack 424 formed over the substrate 421. The substrate 421 includes an active region 422. The processor wafer 420 has two surfaces, 444 and 446. The surface 444 is at a front side of the metal stack 424 and the surface 446 is at a back side of the substrate 421. The surface 444 includes conductive pads, 426 and 428, isolated by a dielectric material layer. The conductive pads, 426 and 428, may contain a metal, such as copper. The dielectric material layer may include silicon oxide, silicon nitride, silicon oxynitride, a low-k material, or another suitable dielectric material. A thickness of the dielectric material layer is selected so that the dielectric material layer will effectively block migration of a metal applied to the surface 444 during a later bonding process. This will be described in more detail below. In an embodiment, the substrate 421 includes silicon. Alternatively, the substrate 421 may include another suitable semiconductor material. The active region 422 includes active and passive circuit components, such as field effect transistors (FETs), complementary metal-oxide semiconductor (CMOS) transistors, FinFETs, high voltage transistors, high frequency transistors, bipolar junction transistors, resistors, capacitors, diodes, fuses, other suitable devices, and/or combinations thereof. The metal stack 424 includes multilayer interconnect structures for electrically coupling circuit components in the active region 422. The interconnect structures include various conductive features, such as contacts, vias, and/or conductive traces. The various conductive features include materials such as copper, aluminum, aluminum/silicon/copper alloy, titanium, titanium nitride, tungsten, polysilicon, metal silicide, and/or combinations thereof. The processor wafer 420 is provided merely as an example, and its exact composition and/or functionality do not limit the inventive principles of the present disclosure.

Referring again to FIG. 4A, a first BSI image sensor wafer 410a includes a substrate 411a and a metal stack 414a formed over the substrate 411a. The substrate 411a includes a photosensitive or photodiode ("PD") region 412a. The BSI wafer 410a has two surfaces, 404a and 406a. The surface 404a is at a front side of the metal stack 414a and the surface 406a is at a back side of the substrate 411a. The surface 404a includes conductive pads, 416a and 418a, isolated by a dielectric material about the same as the dielectric material of the surface 444. The conductive pads, 416a and 418a, use about the same material as that of the conductive pads 426 and 428. The metal stack 414a may include one or more layers of metal separated by inter-layer dielectric (ILD) layers.

The substrate 411a has an initial thickness 413a. In some embodiments, the initial thickness 413a is in a range from about 100 microns (μm) to about 3000 μm, for example between about 500 μm and about 1000 μm. Radiation, such as light, is projected from the back side and enters the substrate 411a through the surface 406a.

In some embodiments, the substrate 411a includes an elementary semiconductor such as silicon or germanium and/or a compound semiconductor, such as silicon germanium, silicon carbide, gallium arsenic, indium arsenide, gallium nitride, and indium phosphide. Other exemplary substrate materials include alloy semiconductors, such as silicon germanium carbide, gallium arsenic phosphide, and gallium indium phosphide. The substrate 411a may also include non-semiconductor materials including soda-lime glass, fused silica, fused quartz, calcium fluoride ($CaF_2$), and/or other suitable materials. In some embodiments, the substrate 411a has one or more layers defined within it, such as an epitaxial layer. For example, in one such embodiment, the substrate 411a includes an epitaxial layer overlying a bulk semiconductor. Other layered substrates include semiconductor-on-insulator (SOI) substrates. In one such SOI substrate, the substrate 411a includes a buried oxide (BOX) layer formed by a process such as separation by implanted oxygen (SIMOX). In various embodiments, the substrate 411a may take the form of a planar substrate, a fin, a nanowire, and/or other forms.

The substrate 411a may include one or more doped regions. For example, the substrate 411a may be doped with a p-type dopant. Suitable p-type dopants include boron, gallium, indium, other suitable p-type dopants, and/or combinations thereof. Alternatively, the substrate 411a may include one or more regions doped with an n-type dopant such as phosphorus, arsenic, other suitable n-type dopants, and/or combinations thereof. Doping may be implemented using a process such as ion implantation or diffusion in various steps and techniques.

The PD region 412a includes one or more sensor element which may be standalone or an integral part of a larger pixel array, such as the array commonly found in a digital camera sensor. The sensor element detects the intensity (brightness) of radiation incident upon the back surface 406a of the substrate 411a. In some embodiments, the incident radiation is visual light. Alternatively, the incident radiation may be infrared (IR), ultraviolet (UV), x-ray, microwave, other suitable radiation, and/or combinations thereof. The sensor element may be configured to respond to particular wavelengths or ranges of wavelengths, such as red, green, and blue wavelengths within the visible light spectrum. The sensor element(s) in the PD region 412a may be formed in the substrate 411a by a method such as diffusion and/or ion implantation.

Although not shown, the substrate 411a includes other structures or devices, such as a pixel circuitry for controlling and communicating with the PD region 412a for image acquisition, shallow trench isolations (STIs) for isolating sensor elements, and other passive or active devices.

Figure 4B:
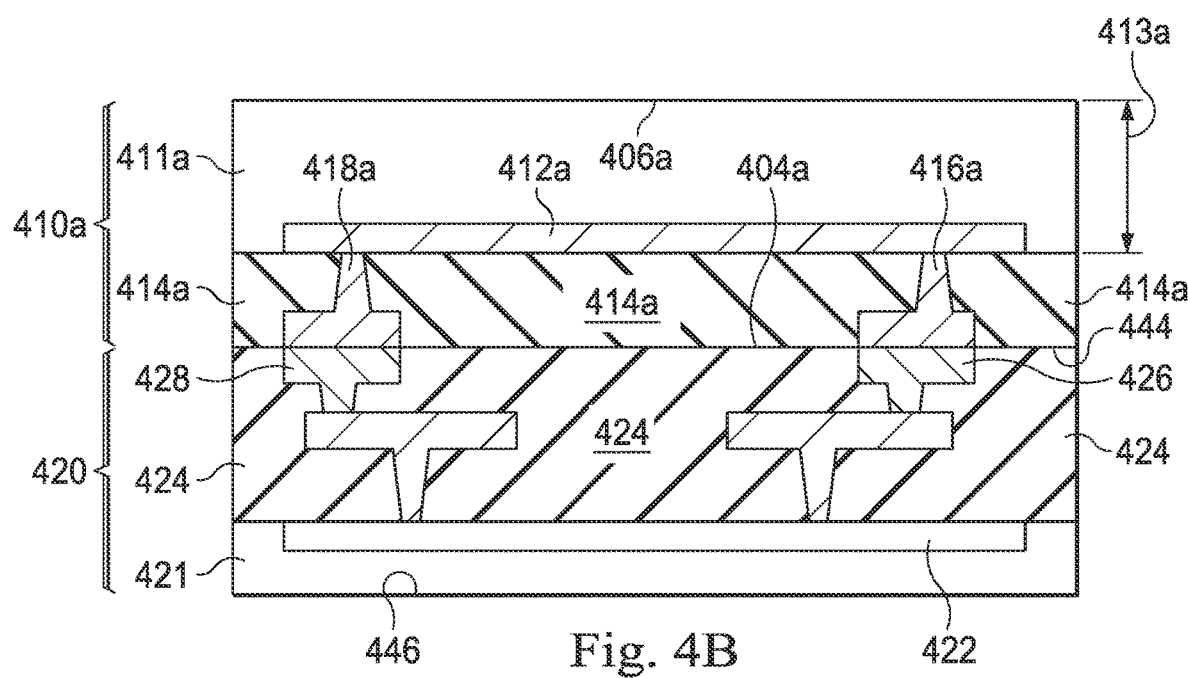

The process flow 300 (FIG. 3) proceeds to operation 306 where the processor wafer 420 is aligned and bonded with the BSI wafer 410a using a hybrid bond process. Referring to FIG. 4B, the surface 444 is directly bonded with the surface 404a with the conductive pads 428 and 426 bonded with the conductive pads 418a and 416a respectively. A hybrid bond process refers to bonding of two surfaces where each surface includes at least two substantially different materials (a hybrid surface). In the present embodiment, the conductive pads, 426, 428, 416a, and 418a, contain a metal, such as copper, while the surfaces 444 and 404a contain a layer of dielectric material such as oxide, silicon oxide, silicon nitride, or silicon oxynitride. In an embodiment, the surfaces 444 and 404a contain a layer of silicon oxynitride having a thickness of at least 30 nanometers (nm) so as to effectively block migration of copper if the two surfaces are misaligned. In another embodiment, the surfaces 444 and 404a contain a layer of silicon nitride having a thickness of at least 5 nm so as to effectively block migration of copper if the two surfaces are misaligned.

In the present embodiment, the hybrid bond process includes an initial bonding process at a lower temperature followed by an annealing process at an elevated temperature. The initial bonding process may use a technique such as a direct bonding or other bonding techniques. Generally, it takes longer, e.g. a few hours, for the initial bonds to form. Therefore, a lower temperature is used during the initial bonding process to avoid undesirable changes or decomposition in the wafers 420 and 410a. In an embodiment, the initial bonding process may take place at room temperature or another temperature that is below 200 degrees Celsius. In an embodiment, pressure is applied to the wafers 420 and 410a for the initial bonds to form. The annealing process is applied after the initial bonding process to strengthen the bonds between the two hybrid surfaces 404a and 444. In the present embodiment, the annealing process undergoes at least two stages of bond formation at temperatures higher than the initial bonding temperature. During a first stage, covalent bonds are formed between the dielectric materials, e.g. between two oxides, of the surfaces 420 and 410a at a first temperature, such as about 200 degrees Celsius. In an embodiment, the first stage takes about one and half hours. During a second stage, metal bonding are formed, e.g. by copper inter-diffusion, at a second temperature that is higher than the first temperature, such as about 350 degrees Celsius. In an embodiment, the second stage takes about half an hour. The temperatures of the annealing process are generally under about 450 degrees Celsius, as higher temperature may lead to damages in the wafers 420 and 410a. However, the specific temperatures and durations disclosed above are mere examples and do not limit the inventive scope of the present disclosure. Moreover, in the present embodiment, bonding of the conductive pads 426/416a and 428/418a is for illustrative purposes only and does not indicate a specific orientation of the BSI wafer 410a with respect to the processor wafer 420.

Figure 4C:
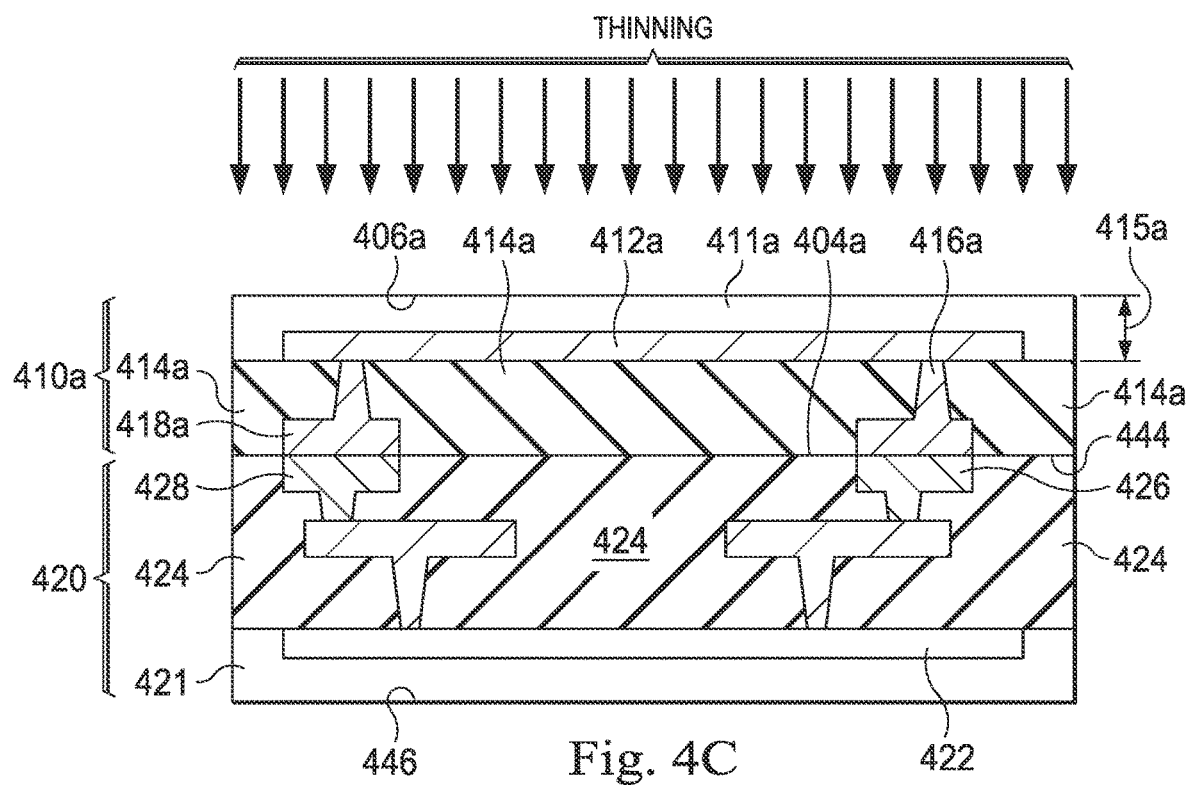

The process flow 300 (FIG. 3) proceeds to operation 308 where the first BSI wafer 410a is thinned down. Referring to FIG. 4C, a thinning process is applied to thin down the BSI wafer substrate 411a from its back side surface 406a. The thinning process may include a mechanical grinding process and a chemical thinning process. A substantial amount of substrate material may be first removed from the substrate 411a during the mechanical grinding process. Afterwards, the chemical thinning process may apply an etching chemical to the back side of the substrate 411a to further thin the substrate 411a to a thickness 415a, which may be on the order of a few microns (μm). The thickness 415a affects a quantum efficiency of the BSI image sensors in the wafer 410a. In some embodiments, the thickness 415a is selected to improve the quantum efficiency of the BSI image sensors. In some embodiments, the thickness 415a is greater than about 1 μm but less than about 5 μm. The particular thicknesses disclosed in the present disclosure are mere examples and other thicknesses may be implemented depending on the type of application and design of the integrated camera module 100 (FIG. 1).

Figure 4D:
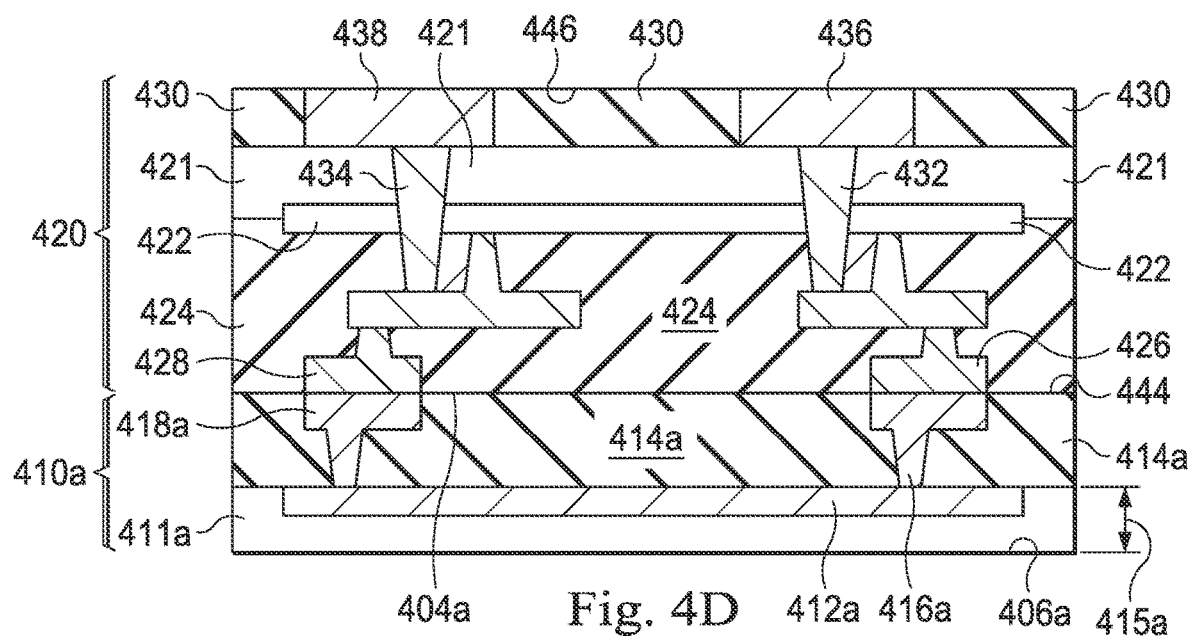

The process flow 300 (FIG. 3) proceeds to operation 310 where the backside of the substrate 421 undergoes a metallization process. Referring to FIG. 4D, a passivation layer 430 is formed over the substrate 421 using a suitable process such as a process including a deposition process and a chemical mechanical polishing (CMP) process. In an embodiment, the passivation layer 430 includes a dielectric material, such as oxide or silicon oxide. Conductive features, 436, 438, 432 and 434, are further formed into the passivation layer 430 and through the substrate 421 for coupling the metal stack 424 to the passivation layer 430. The process of forming the conductive features includes etching the various layers to form thru-layer or thru-silicon vias and/or contact trenches; depositing a conductive material, such as copper, into the vias and/or trenches; and performing a CMP process to the conductive material.

Figure 4E:
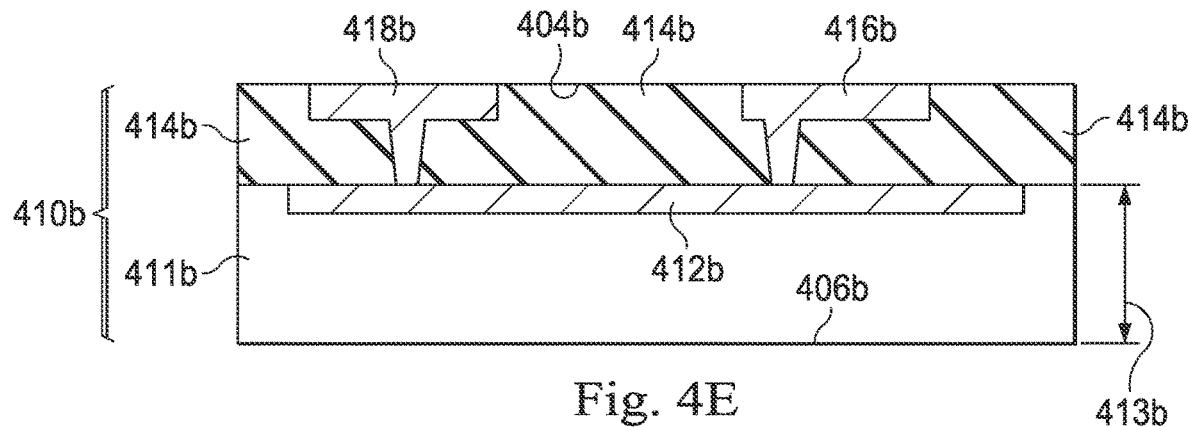

The process flow 300 (FIG. 3) proceeds to operation 312 where a second BSI wafer 410b is received. Referring to FIG. 4E, the second BSI wafer 410b includes a substrate 411b and a metal stack 414b formed over the substrate 411b. The substrate 411b has a thickness 413b and includes a photosensitive or photodiode ("PD") region 412b. The BSI wafer 410b has two surfaces, 404b and 406b. The surface 404b is at a front side of the metal stack 414b and the surface 406b is at a back side of the substrate 411b. The surface 404b includes conductive pads, 416b and 418b, isolated by a dielectric material about the same as the dielectric material of the surface 446. The conductive pads, 416b and 418b, use about the same material as that of the conductive pads 436 and 438. The metal stack 414b may include one or more layers of metal separated by inter-layer dielectric (ILD) layers. The BSI wafer 410b may use a composition similar to or different from the BSI wafer 410a. Moreover, the BSI wafers 410a and 410b may contain the same or different number of imaging pixels.

Figure 4F:
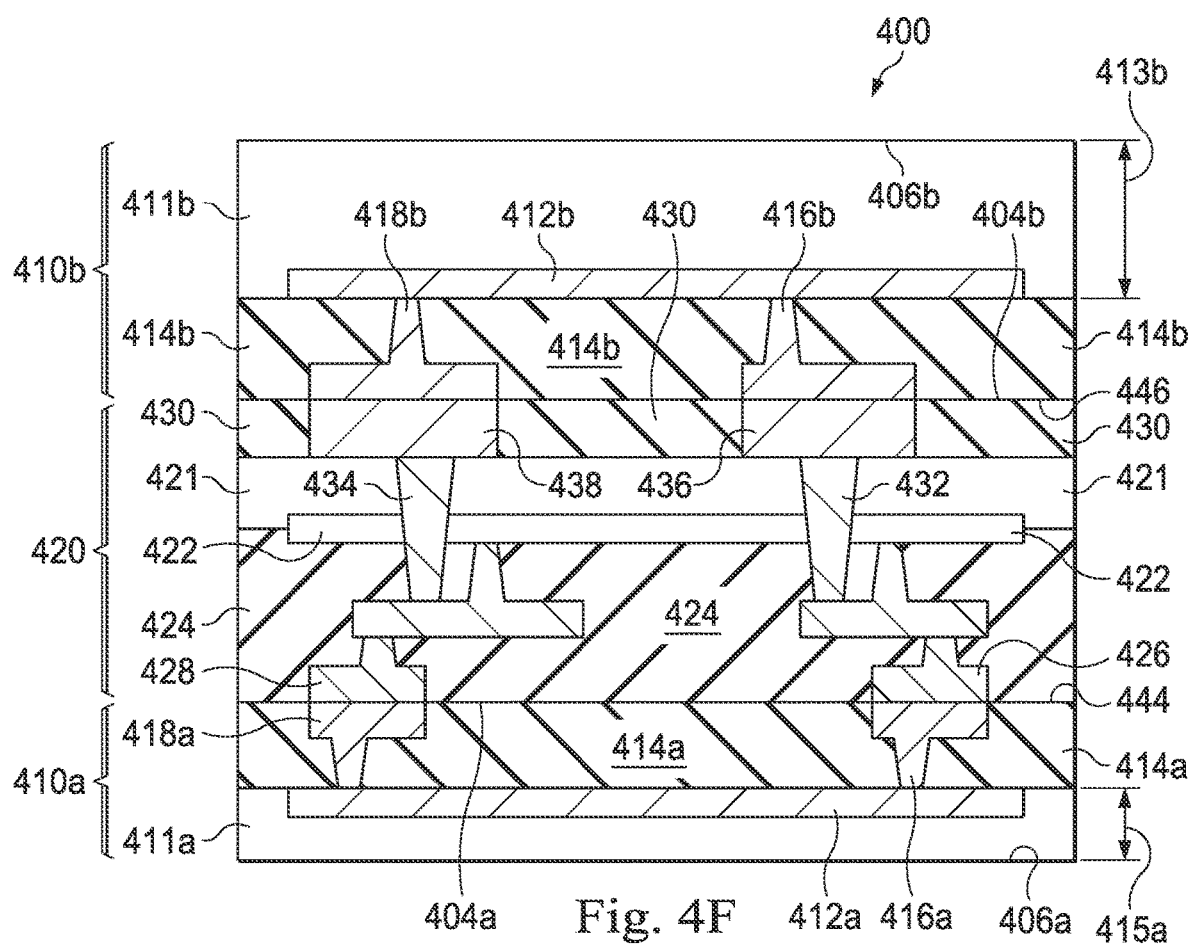

The process flow 300 (FIG. 3) proceeds to operation 314 where the second BSI wafer 410b is aligned and bonded with the processor wafer 420 using a hybrid bond process. Referring to FIG. 4F, the surface 404b of the BSI wafer 410b is directly bonded with the surface 446 of the processor wafer 420 with the conductive pads 418b and 416b on the BSI wafer 410b bonded with the conductive pads 438 and 436 on the processor wafer 420 respectively. The hybrid bond process in this operation may be substantially similar to the hybrid bond process in operation 306, with temperatures and duration suitable for the material/composition of the surfaces 446 and 404b. The operation 314 thus produces an assembly 400 with the processor wafer 420 bonded in between the BSI wafers 410a and 410b.

Figure 4G:
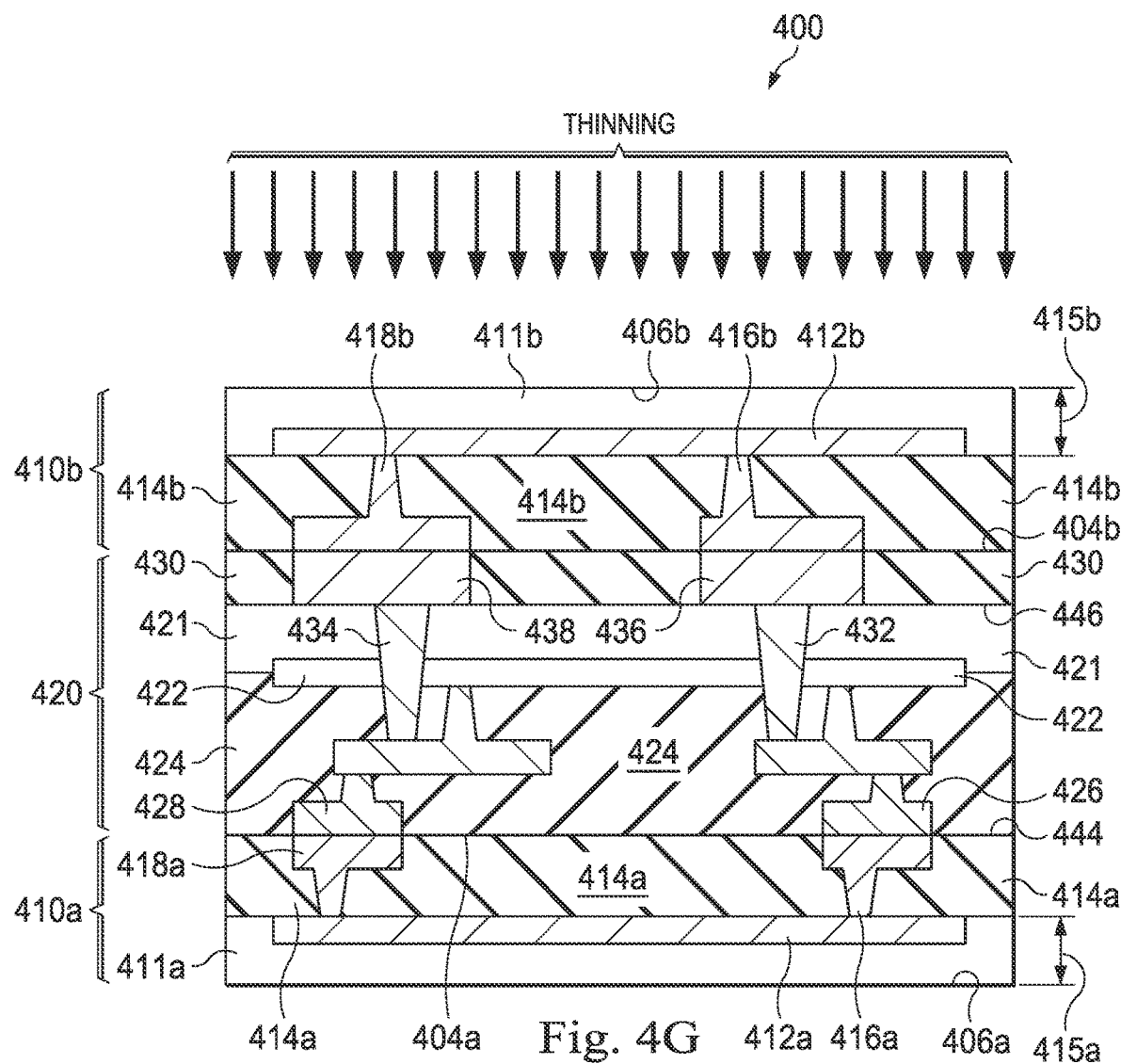

The process flow 300 (FIG. 3) proceeds to operation 316 where the second BSI wafer 410b is thinned down. Referring to FIG. 4G, a thinning process is applied to thin down the BSI wafer substrate 411b from its back side surface 406b. The thinning process in this operation may be substantially similar to the thinning process in operation 308. The substrate 411b is thinned to a thickness 415b, which may be on the order of a few microns (μm). In some embodiments, the thickness 415b is greater than about 1 μm but less than about 5 μm. The thickness 415b may be similar to or different from the thickness 415a depending on the type of application and design of the integrated camera module 100 (FIG. 1).

Figure 4H:
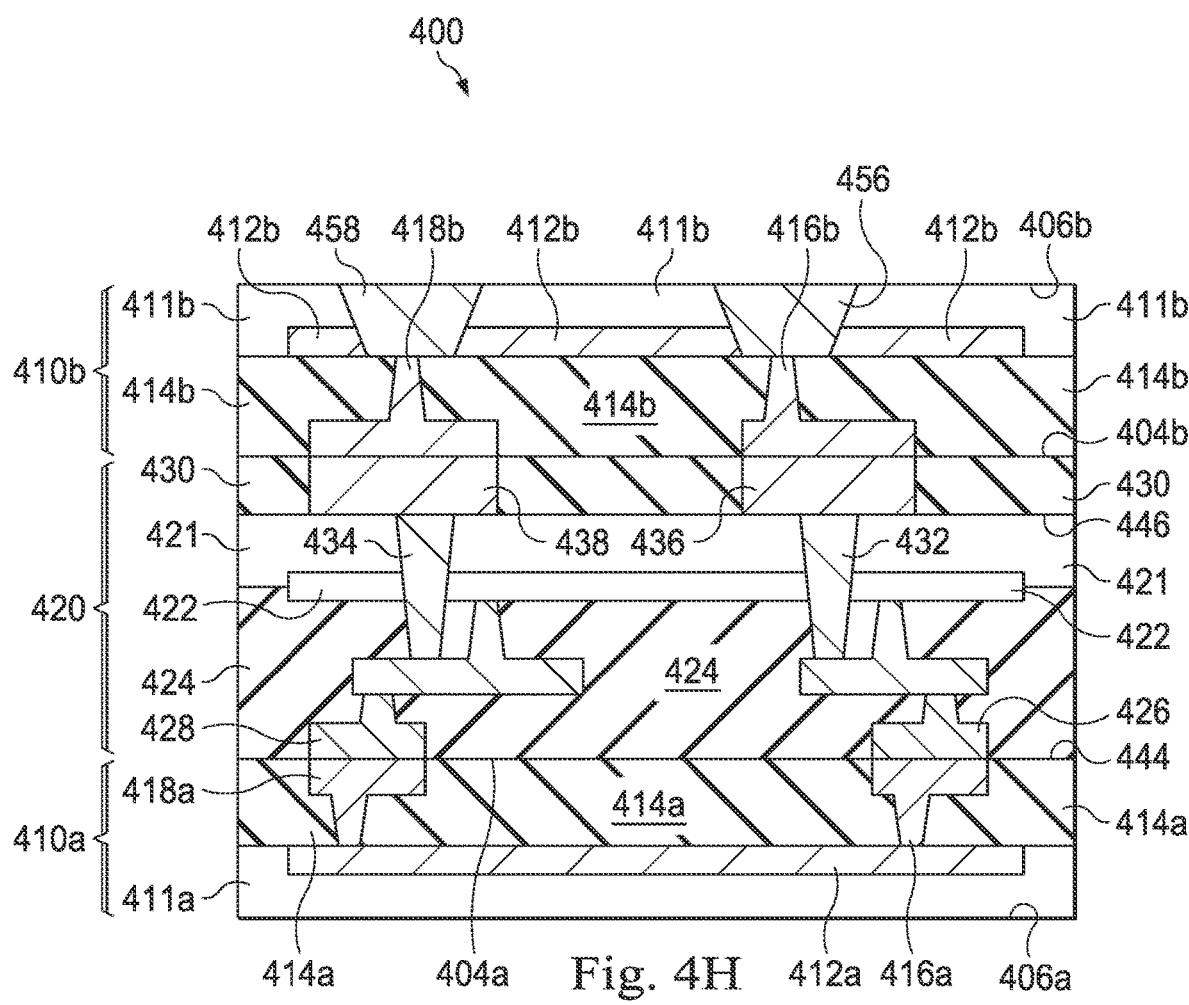

The process flow 300 (FIG. 3) proceeds to operation 318 where conductive features are formed on the back side of the BSI wafer 410b (or 410a) so that the assembly 400 may be further integrated with other components of the integrated camera module 100 (FIG. 1). Referring to FIG. 4H, conductive features 458 and 456 are formed into the substrate 411b and are coupled to the metal stack 414b and/or the metal stack 424. The process of forming the conductive features 458 and 456 includes etching the substrate 411b to form thru-layer or thru-silicon vias and/or contact trenches; depositing a conductive material, such as copper, into the vias and/or trenches; and performing a polishing process to the conductive material. Either the back side of the BSI wafer 410b or the back side of the BSI wafer 410a may be used for operation 318.

The process flow 300 (FIG. 3) proceeds to operation 320 to complete the integrated camera module 100 (FIG. 1). Operation 320 may include forming color filters and lens over both sides of the assembly 400, installing glass covers over the color filters and lens, installing package balls over the conductive pads 448 and 446 for further integration, and so on.

Figure 5:
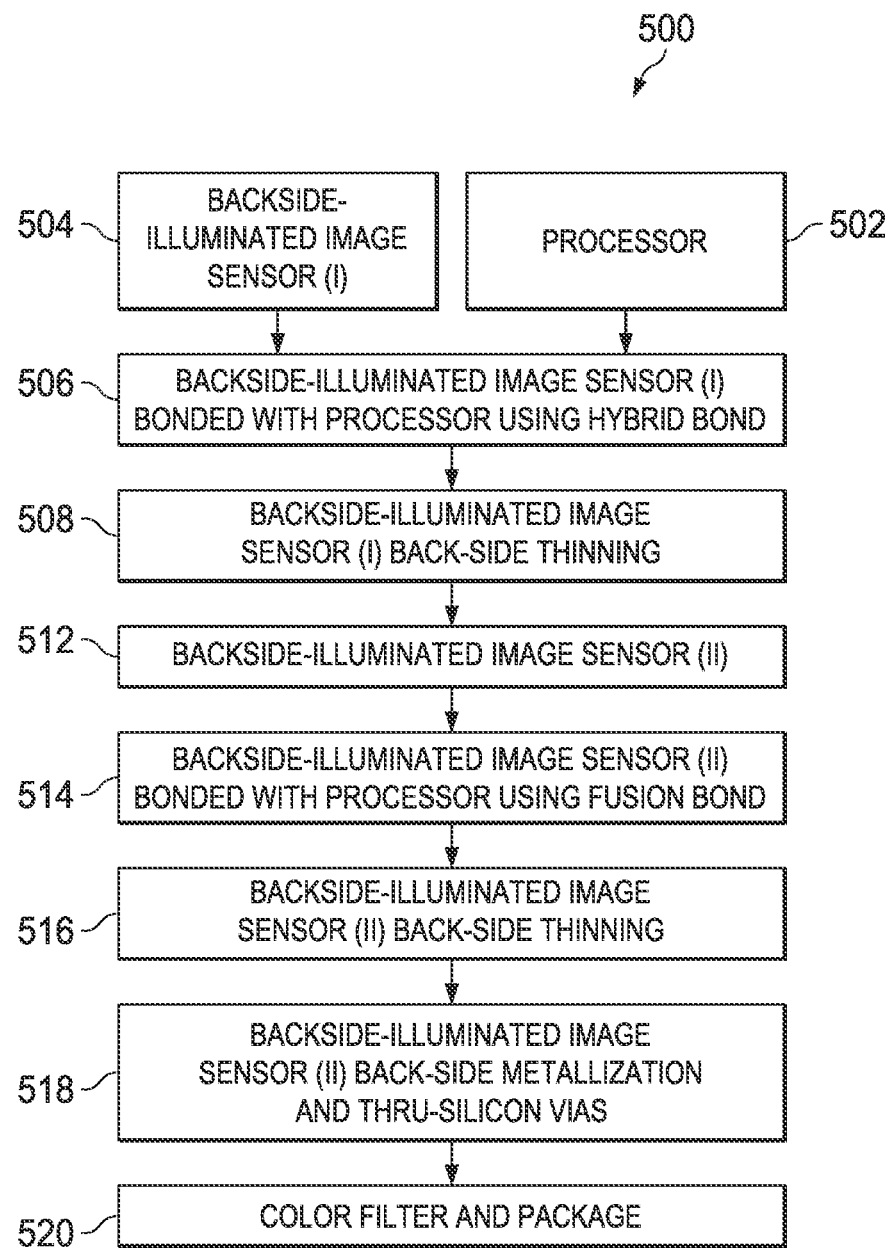
FIG. 5 is a flow chart for fabricating an integrated camera module with dual-facing BSI image sensors such as shown in FIG. 2, in accordance with an embodiment.

FIG. 5 illustrates a process flow 500 for fabricating an integrated camera module with dual-facing BSI image sensors, such as the camera module 200 (FIG. 2), according to various aspects of the present disclosure. FIG. 5 is best understood in conjunction with FIGS. 6A-6H. For simplicity purposes, where an operation in the process flow 500 is similar to an operation in the process flow 300, a reference to the process flow 300 is made and differences are highlighted.

Figure 6A:
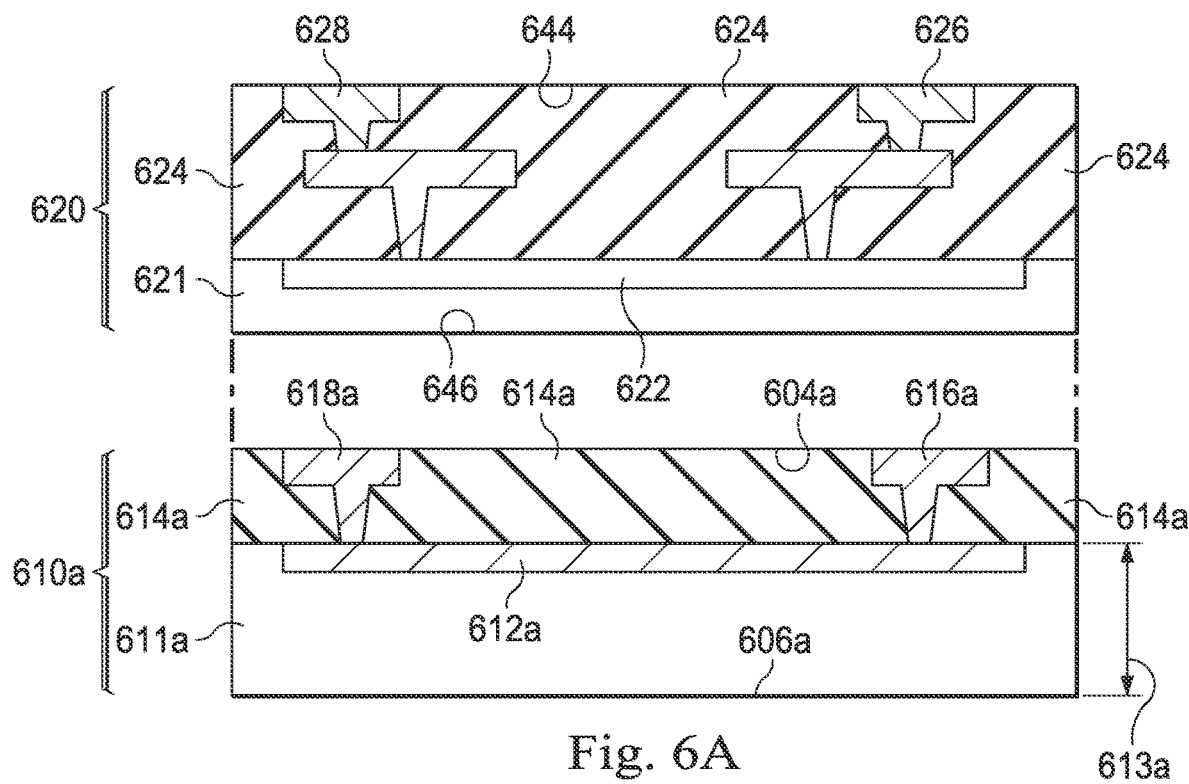

The process flow 500 (FIG. 5) receives a processor wafer (operation 502) and a first BSI image sensor wafer (operation 504). Referring to FIG. 6A, an exemplar processor wafer 620 includes a substrate 621 and a metal stack 624 formed over the substrate 621. The substrate 621 includes an active region 622. The processor wafer 620 has two surfaces, 644 and 646. The surface 644 is at a front side of the metal stack 624 and the surface 646 is at a back side of the substrate 621. The surface 644 includes conductive pads, 626 and 628, isolated by a dielectric material. The structure and composition of the processor wafer 620 is similar to the processor wafer 420 (FIG. 4A). Also shown in FIG. 6A is an exemplar BSI image sensor wafer 610a. The BSI wafer 610a includes a substrate 611a and a metal stack 614a formed over the substrate 611a. The substrate 611a includes a photosensitive or photodiode ("PD") region 612a. The BSI wafer 610a has two surfaces, 604a and 606a. The surface 604a is at a front side of the metal stack 614a and the surface 606a is at a back side of the substrate 611a. The surface 604a includes conductive pads, 616a and 618a, isolated by a dielectric material about the same as the dielectric material of the surface 644. The substrate 611a has an initial thickness 613a. The structure and composition of the BSI wafer 610a is similar to the BSI wafer 410a (FIG. 4A).

Figure 6B:
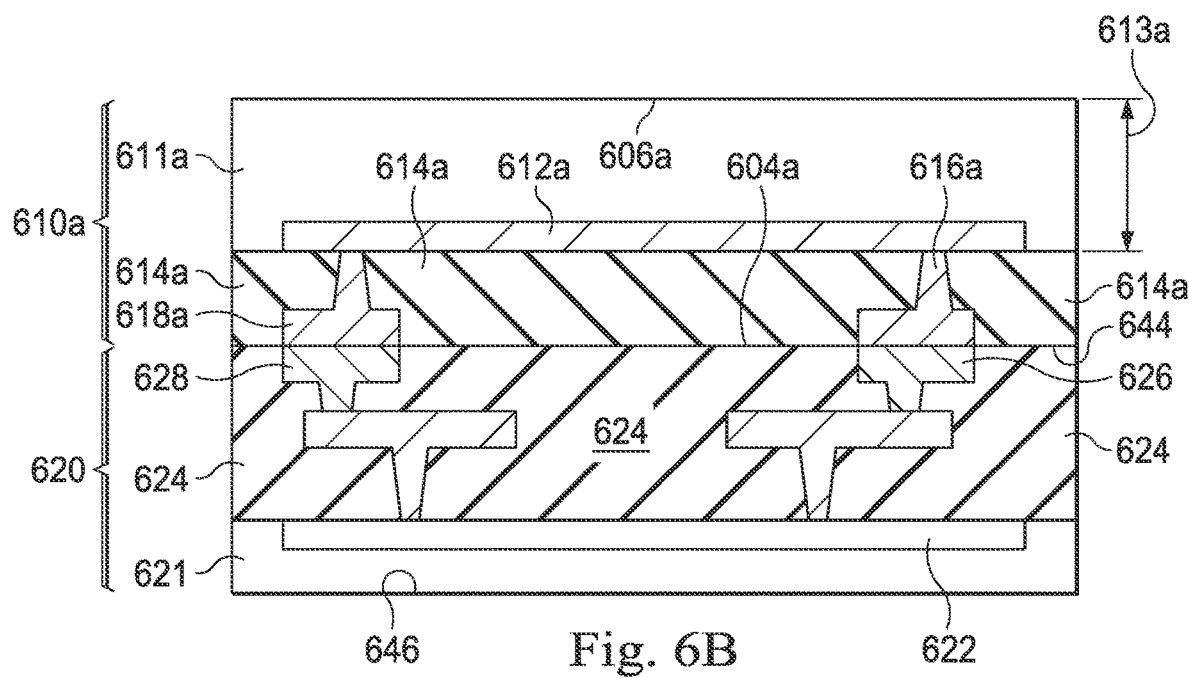

The process flow 500 (FIG. 5) proceeds to operation 506 where the processor wafer 620 is aligned and bonded with the BSI wafer 610a using a hybrid bond process. Referring to FIG. 6B, the surface 644 is directly bonded with the surface 604a with the conductive pads 628 and 626 bonded with the conductive pads 618a and 616a respectively. The hybrid bond process in this operation is similar to the hybrid bond process in operation 306 (FIG. 3).

The process flow 500 (FIG. 5) proceeds to operation 508 where the first BSI wafer 610a is thinned down. Referring to FIG. 6C, a thinning process similar to the thinning process in operation 308 (FIG. 3) is applied to thin down the BSI wafer substrate 611a from its back side surface 606a to a thickness 615a, which may be on the order of a few microns (μm). In some embodiments, the thickness 615a is greater than about 1 μm but less than about 5 μm. The particular thicknesses disclosed in the present disclosure are mere examples and other thicknesses may be implemented depending on the type of application and design of the integrated camera module 200 (FIG. 2).

The process flow 500 (FIG. 5) proceeds to operation 512 where a second BSI wafer 610b is received. Referring to FIG. 6D, the second BSI wafer 610b includes a substrate 611b and a metal stack 614b formed over the substrate 611b. The substrate 611b has a thickness 613b and includes a PD region 612b. The BSI wafer 610b has two surfaces, 604b and 606b. The surface 604b is at a front side of the metal stack 614b and the surface 606b is at a back side of the substrate 611b. A difference between the BSI wafer 610b and the second BSI wafer 410b (FIG. 4E) received in the process flow 300 (FIG. 3) is that the surface 604b does not include conductive features and only includes a material which is about the same as the material of the surface 646 on the back side of the processor wafer substrate 621. The BSI wafers 610a and 610b may contain the same or a different number of imaging pixels.

Figure 6E:
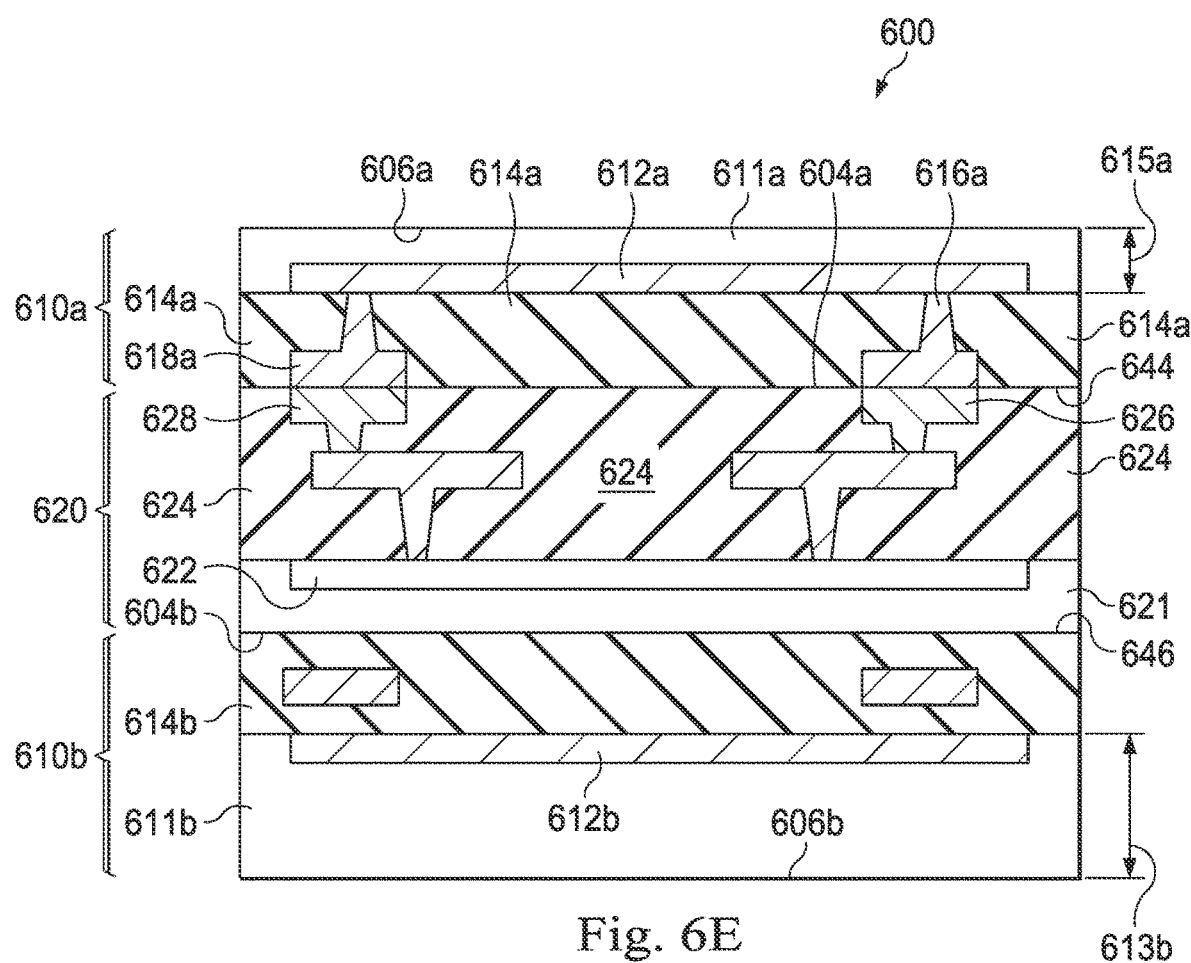

The process flow 500 (FIG. 5) proceeds to operation 514 where the second BSI wafer 610b is aligned and bonded with the processor wafer 620 using a fusion bond process. Referring to FIG. 6E, the surface 646 is directly bonded with the surface 604b. A fusion bond process refers to bonding of two surfaces where the two surfaces have about same material. In an embodiment, the two surfaces, 646 and 604b, include silicon or silicon oxide. In another embodiment, the two surfaces, 646 and 604b, include silicon oxynitride or silicon nitride. Other materials or combinations suitable for direct bonding may be used for the two surfaces 646 and 604b. The fusion bond process includes an initial bonding process followed by an annealing process. The initial bonding process may use a direct bonding technique or other bonding techniques and is performed at a suitable temperature, such as below 200 degrees Celsius. The annealing process is used to strengthen the bonds between the two surfaces 646 and 604b. In an embodiment, the annealing process is used to convert hydrogen bonds formed in the initial bonding process to covalent bonds at a suitable temperature, such as about 200 degrees Celsius. The operation 514 thus produces an assembly 600 with the processor wafer 620 bonded in between the BSI wafers 610a and 610b.

Figure 6F:
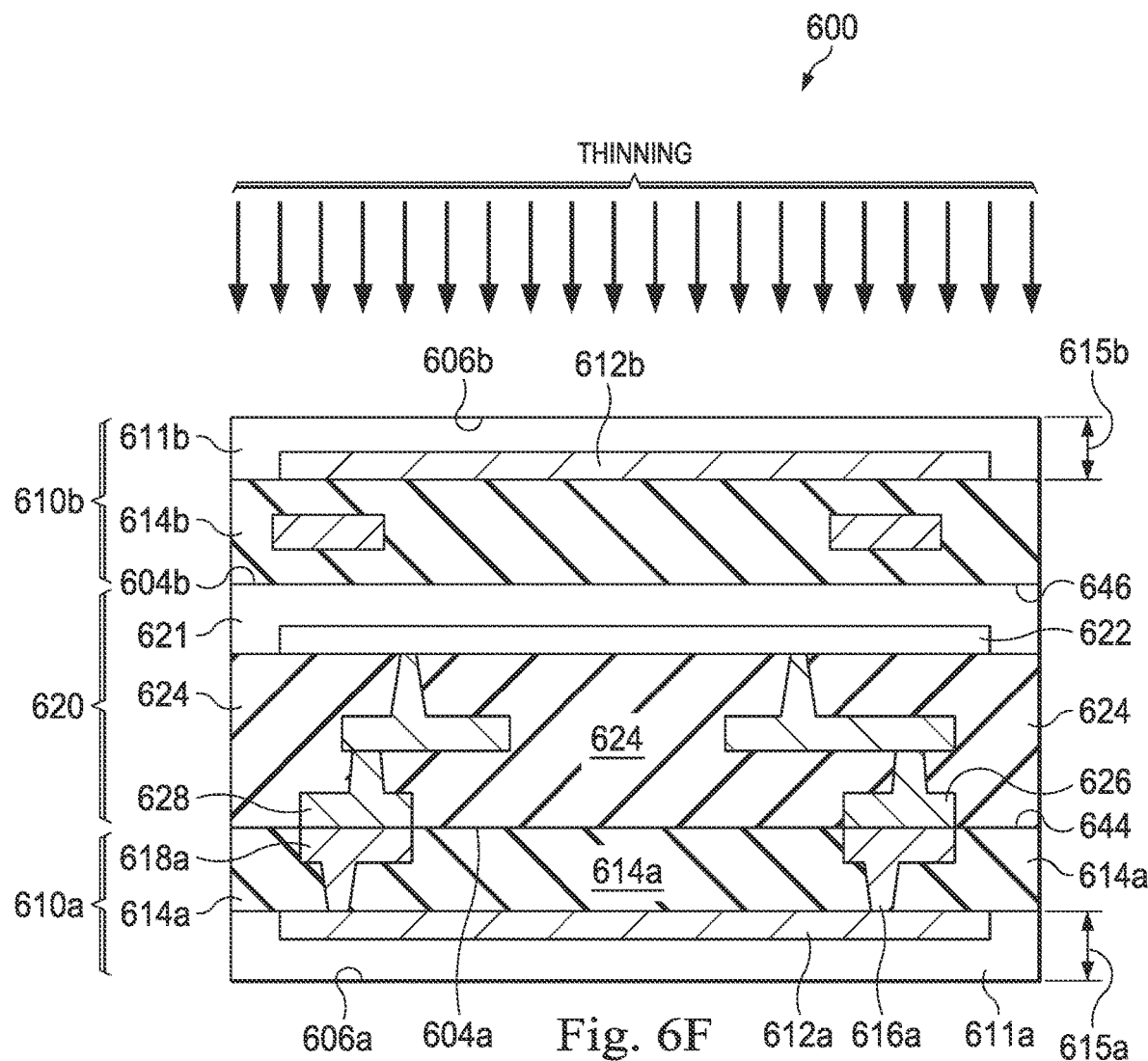

The process flow 500 (FIG. 5) proceeds to operation 516 where the second BSI wafer 610b is thinned down. Referring to FIG. 6F, a thinning process is applied to thin down the BSI wafer substrate 611b from its back side surface 606b. The thinning process in this operation is similar to the thinning process in operation 316 (FIG. 3). The substrate 611*b* is thinned to a thickness 615*b*, which may be on the order of a few microns (μm). In some embodiments, the thickness 615*b* is greater than about 1 μm but less than about 5 μm. The thickness 615*b* may be similar to or different from the thickness 615*a* depending on the type of application and design requirements of the integrated camera module 200 (FIG. 2).

Figure 6G:
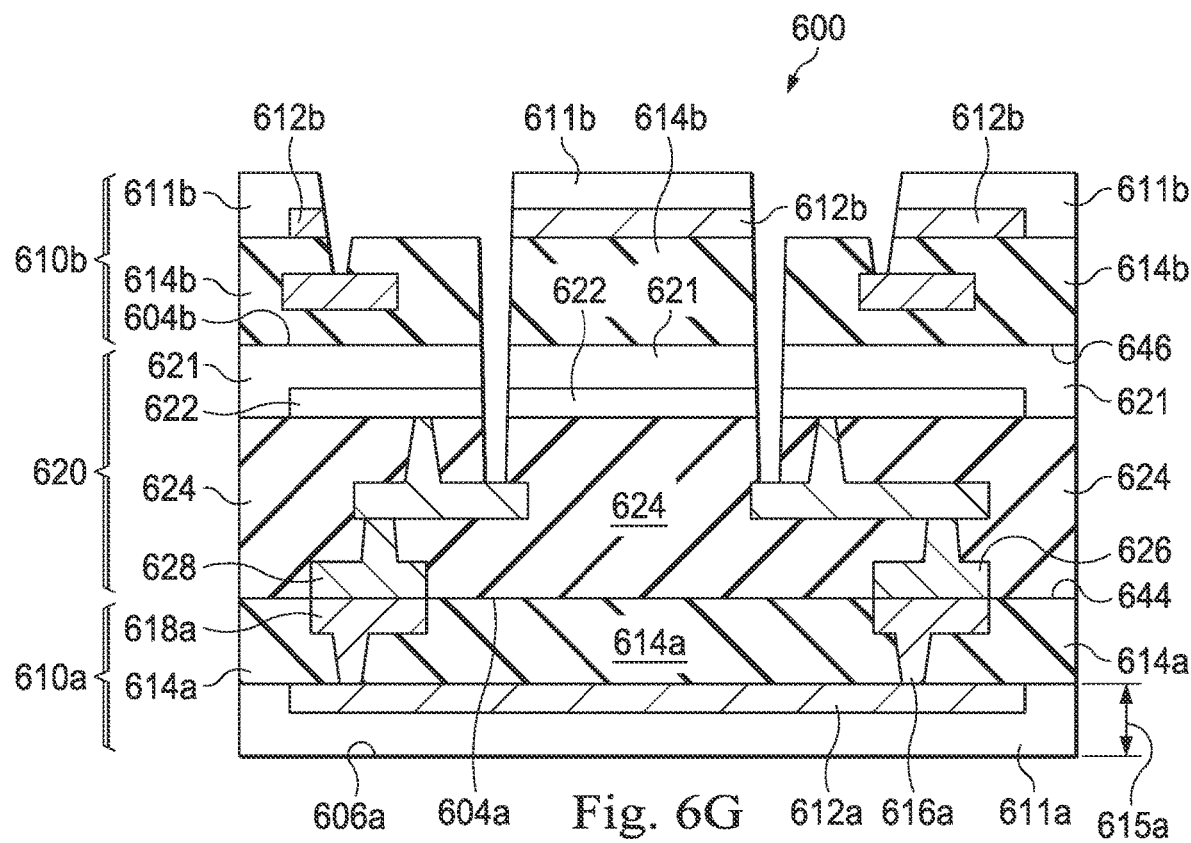
Figure 6H:
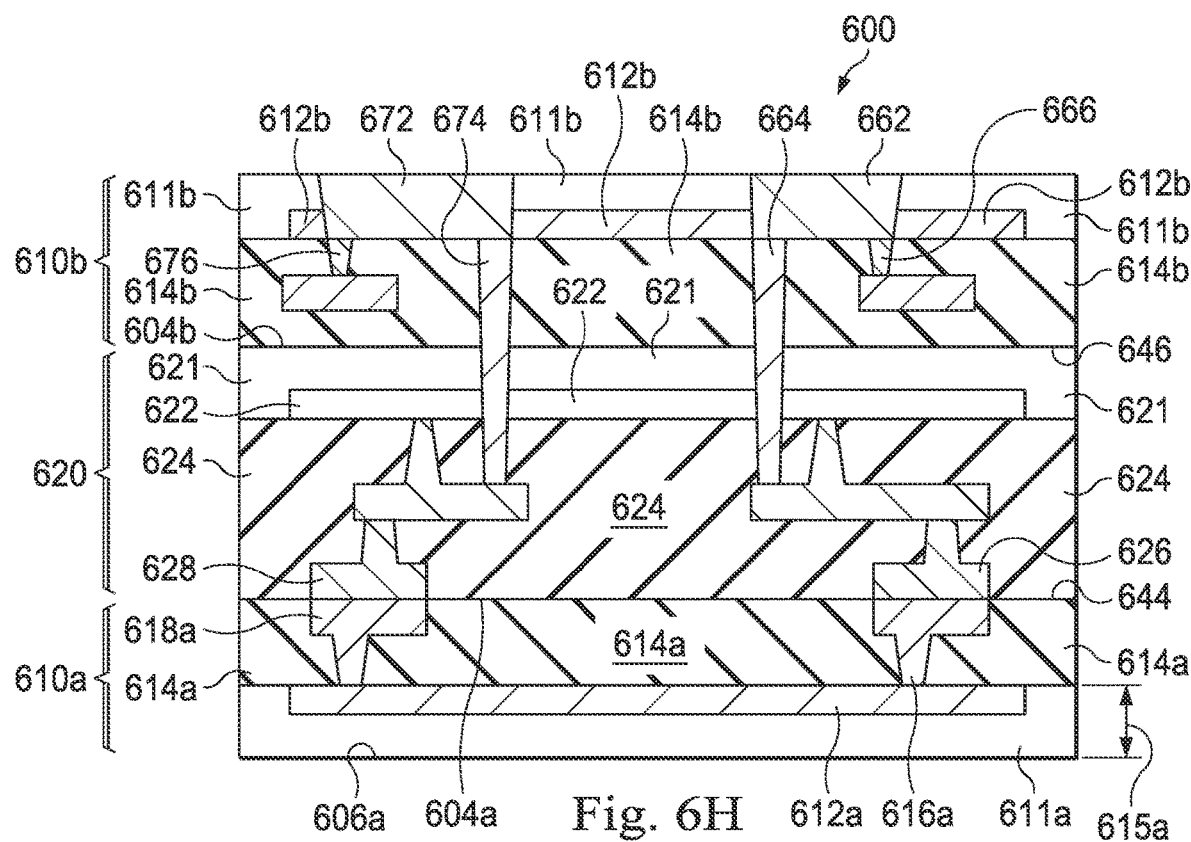

The process flow 500 (FIG. 5) proceeds to operation 518 where conductive pads are formed over the surface 606*b* and thru-layer and/or thru-silicon vias are formed to electrically couple the conductive pads to both the second BSI wafer 610*b* and the processor wafer 620. Referring to FIG. 6G, in the present embodiment, operation 518 etches the back side of the substrate 611*b* for defining openings for conductive pads, etches through the substrate 611*b* for defining openings for vias contacting the metal stack 614*b*, and etches through both the second BSI wafer 610*b* and the substrate 621 for defining openings for vias contacting the metal stack 624. Referring to FIG. 6H, operation 518 proceeds to forming an isolation layer in the openings by a process, such as deposition; etching the isolation layer; depositing a conductive material into the etched isolation layer; and performing a polishing process, such as a CMP process, to the conductive material to form the conductive pads, 662 and 672, and the thru-silicon vias, 664, 666, 674 and 676. Other embodiments of forming the conductive pads 662 and 672 and electrically coupling them to the metal stacks 614*b* and 624 are possible.

The process flow 500 (FIG. 5) proceeds to operation 520 to complete the integrated camera module 200 (FIG. 2). Operation 520 may include forming color filters and lens over both sides of the assembly 600; installing glass covers over the color filters and lens; installing package balls over the conductive pads, 662 and 672 for further integration; and so on.

Figure 7A:
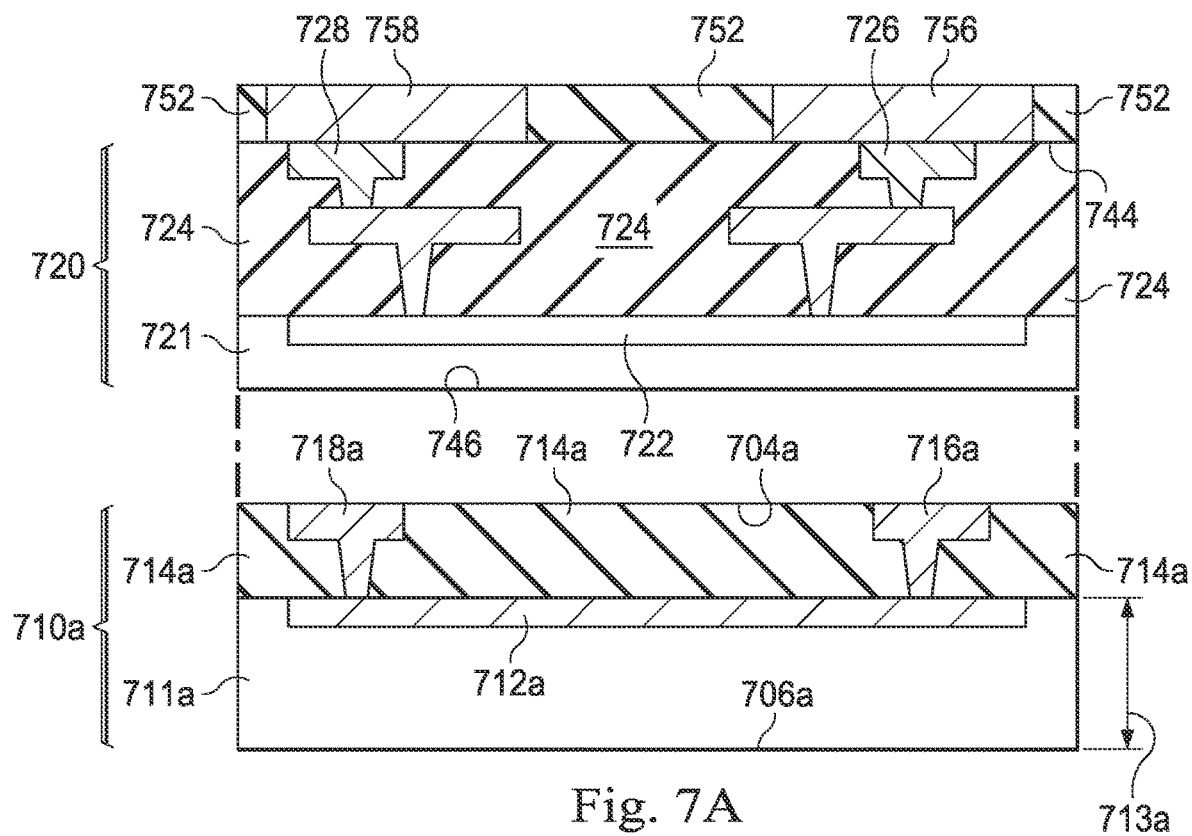
FIGS. 7A and 7B show an embodiment of an integration of a BSI image sensor wafer with a processor wafer according to various aspects of the present disclosure.
Figure 7B:
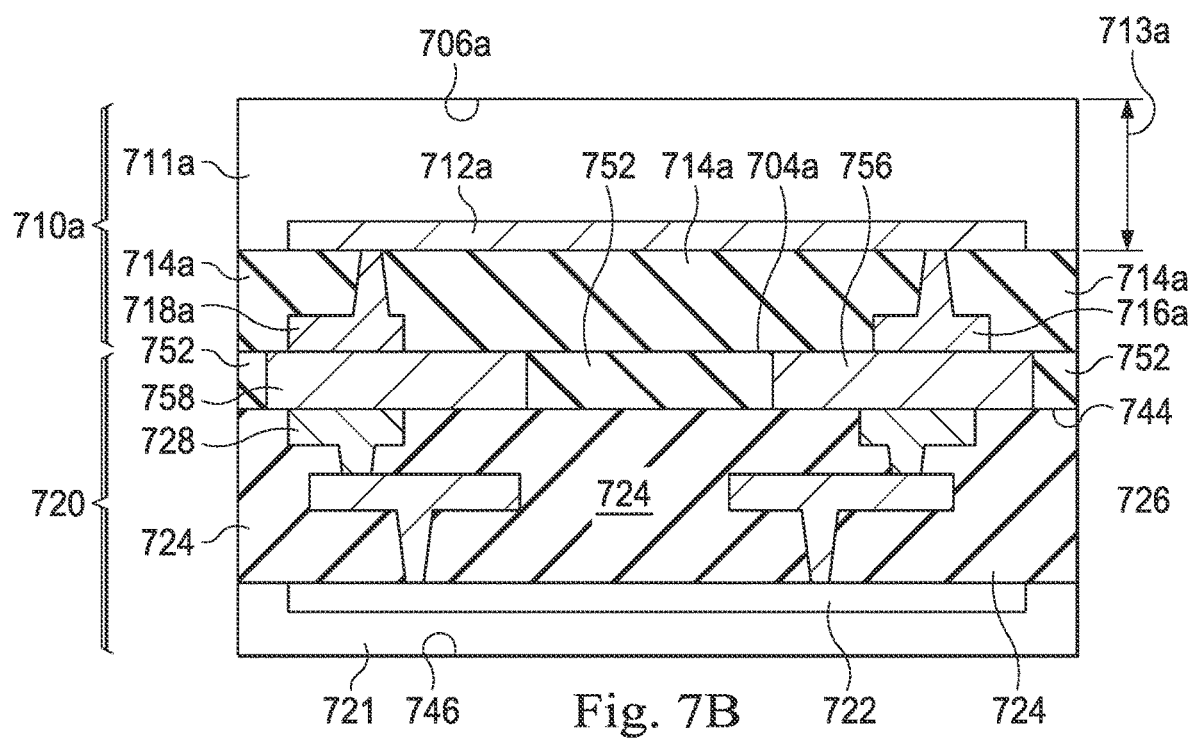

In both the process flows, 300 and 500, a hybrid bond process is used to bond a BSI wafer to a processor wafer, such as illustrated in FIGS. 4B, 4F and 6B. FIGS. 7A and 7B illustrate a method of using a redistribution layer during such a hybrid bond process.

Referring to FIG. 7A, a redistribution layer 752 is formed over a metal stack 724 of a processor wafer 720. The redistribution layer 752 includes conductive pads 756 and 758 that are electrically coupled to the conductive pads 726 and 728 and substantially extend surface areas of the conductive pads 726 and 728 respectively. The conductive pads 756 and 758 are isolated by a dielectric material, such as oxide. The process of forming the redistribution layer 752 includes depositing the dielectric material over the metal stack 724, etching the dielectric material for defining openings for the conductive pads 756 and 758, filling the openings with a conductive material such as copper, and performing a polishing process, such as a CMP process, to the conductive material. FIG. 7A also shows a BSI wafer 710*a* with a bonding surface 704*a* and two conductive pads 716*a* and 718*a* on the bonding surface 704*a*.

Referring to FIG. 7B, the BSI wafer 710*a* is aligned and bonded to the processor wafer 720 with the redistribution layer 752 providing another bonding surface. Since the conductive pad 756 (or 758) has a substantially larger surface area than the conductive pad 716*a* (or 718*a*), using the redistribution layer 752 generally provides benefits for increasing design tolerance of the conductive pad 716*a* (or 718*a*) and increasing design tolerance of the alignment operation during the hybrid bond process. A redistribution layer, such as the layer 752, may be part of the processor wafer 720 when the processor wafer 720 is received, such as in the operation 302 (FIG. 3) and the operation 502 (FIG. 5). Alternatively, the processor wafer 720 may be processed to include the redistribution layer 752 after it is received and before it is bonded with the BSI wafer. Alternatively, a redistribution layer may be formed over a metal stack of a BSI wafer before it is bonded to a metal stack of a processor wafer.

Figure 8:
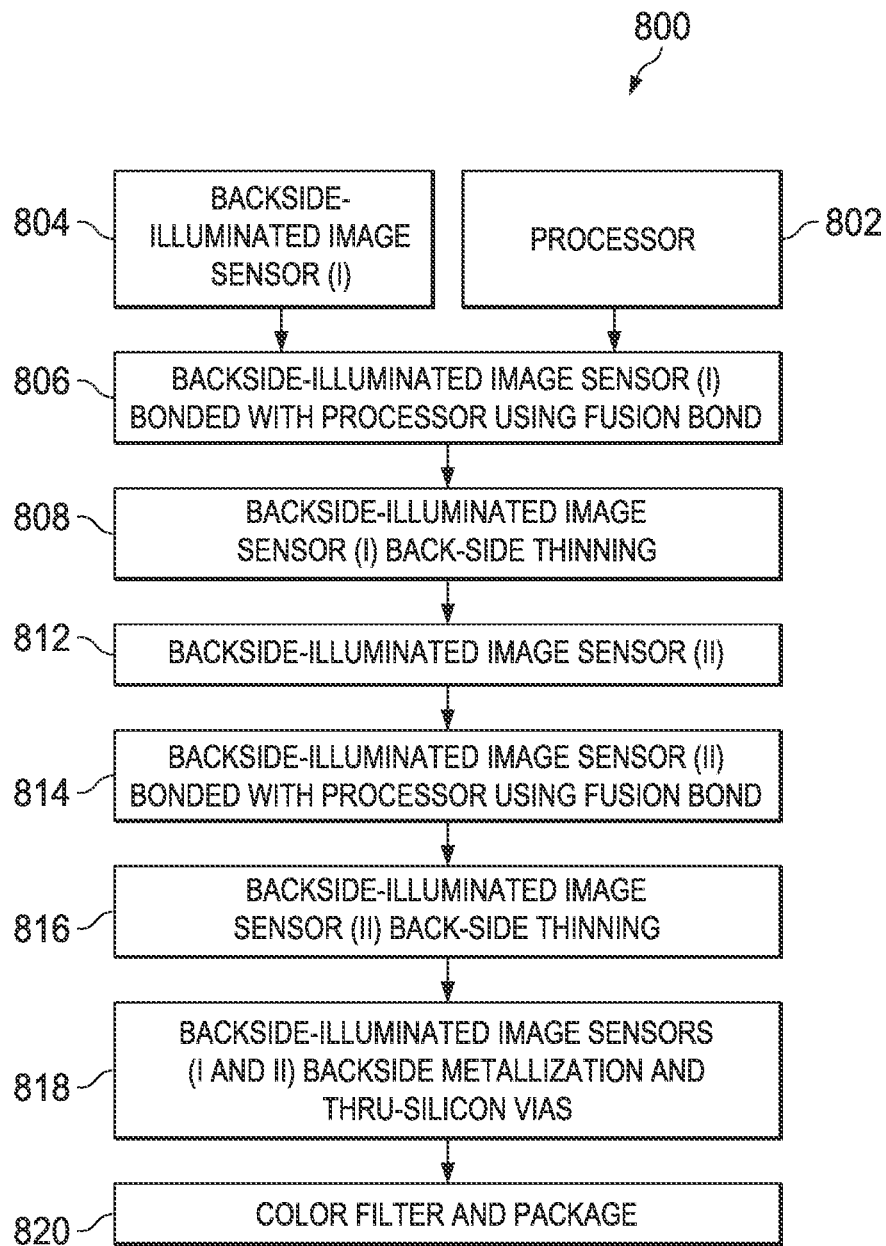
FIG. 8 is a flow chart for fabricating an integrated camera module with dual-facing BSI image sensors, in accordance with an embodiment.

FIG. 8 illustrates a process flow 800 for fabricating an integrated camera module with dual-facing BSI image sensors according to various aspects of the present disclosure. The process flow 800 is similar to the process flow 500 (FIG. 5), with differences discussed below. One difference is that both BSI sensors are bonded with a processor wafer using fusion bond processes in the process flow 800. FIG. 8 can be better understood when discussed with an example device, as shown in FIGS. 9A-9H. For simplicity purposes, where an operation in the process flow 800 is similar to an operation in the process flow 500, a reference to the process flow 500 is made and differences are highlighted.

Figure 9A:
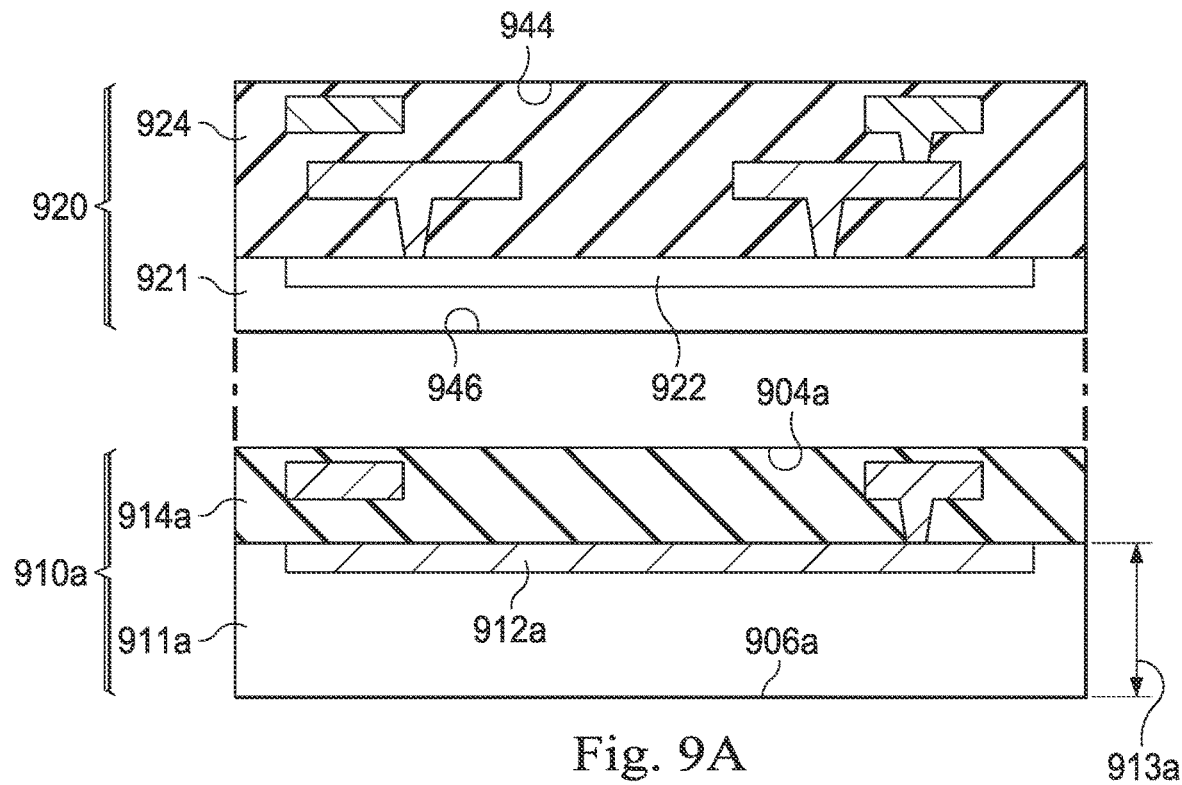

The process flow 800 receives a processor wafer (operation 802) and a first BSI image sensor wafer (operation 804). Referring to FIG. 9A, an exemplar processor wafer 920 includes a substrate 921 and a metal stack 924 formed over the substrate 921. The substrate 921 includes an active region 922. The processor wafer 920 has two surfaces, 944 and 946. The surface 944 is at a front side of the metal stack 924 and the surface 946 is at a back side of the substrate 921. The surface 944 includes a dielectric material. The structure and composition of the processor wafer 920 is similar to the processor wafer 620 (FIG. 6A). A difference is that the surface 944 does not include conductive pads. Also shown in FIG. 9A is an exemplar BSI image sensor wafer 910*a*. The BSI wafer 910*a* includes a substrate 911*a* and a metal stack 914*a* formed over the substrate 911*a*. The substrate 911*a* includes a photosensitive or photodiode ("PD") region 912*a*. The BSI wafer 910*a* has two surfaces, 904*a* and 906*a*. The surface 904*a* is at a front side of the metal stack 914*a* and the surface 906*a* is at a back side of the substrate 911*a*. The surface 904*a* includes a dielectric material about the same as the dielectric material of the surface 944. The substrate 911*a* has an initial thickness 913*a*. The structure and composition of the BSI wafer 910*a* is similar to the BSI wafer 610*a* (FIG. 6A). A difference is that the surface 904*a* does not include conductive pads.

Figure 9B:
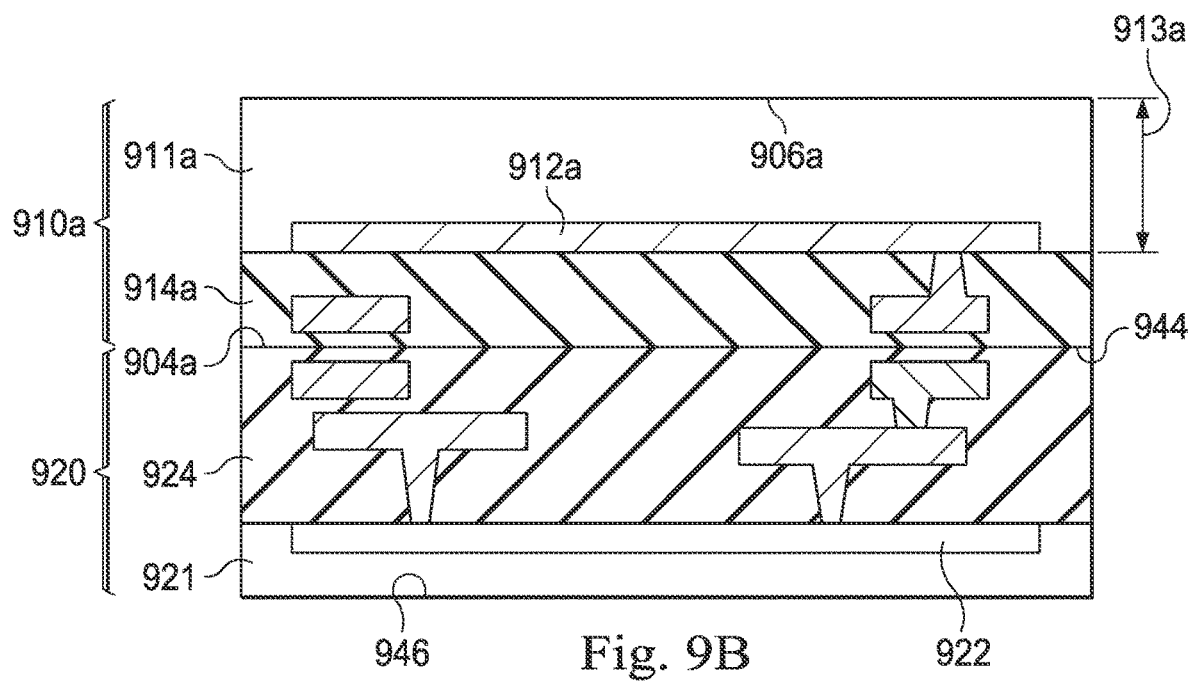

The process flow 800 (FIG. 8) proceeds to operation 806 where the processor wafer 920 is aligned and bonded with the BSI wafer 910*a* using a fusion bond process. Referring to FIG. 9B, the surface 944 is directly bonded with the surface 904*a*. The fusion bond process in this operation is similar to the fusion bond process in operation 514 (FIG. 5).

Figure 9C:
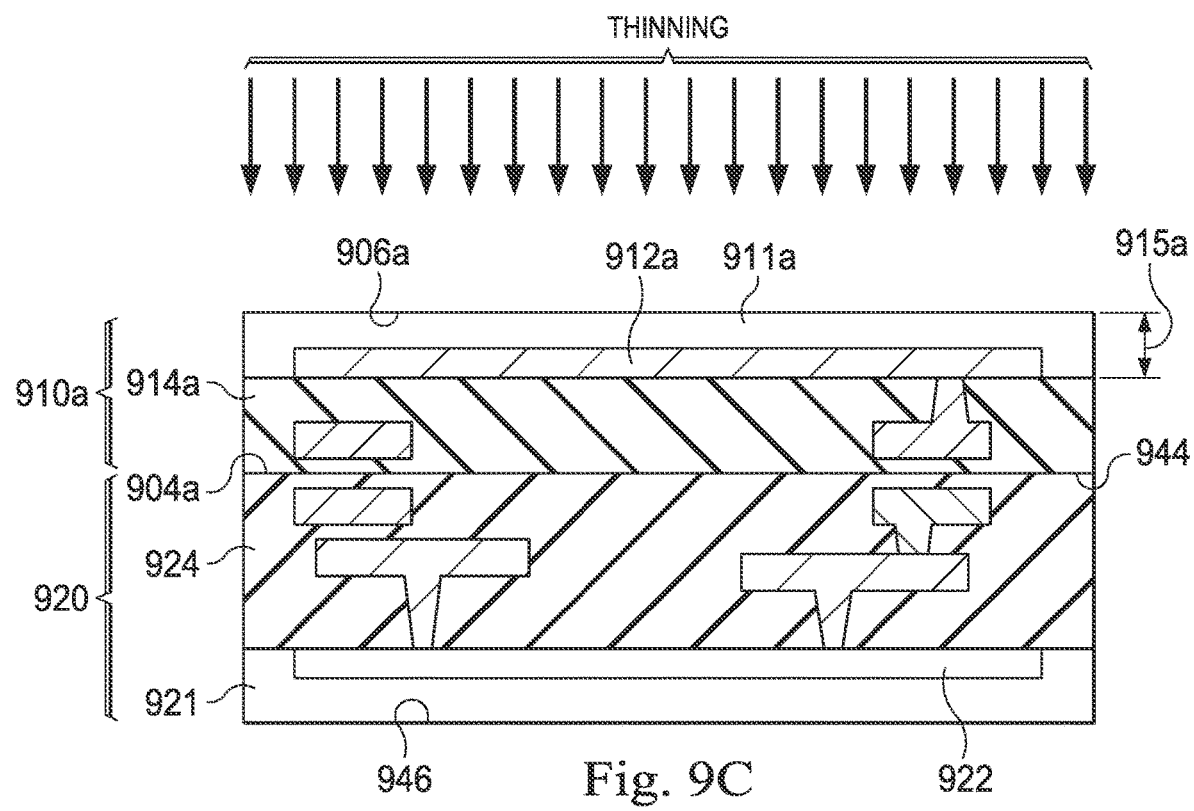

The process flow 800 (FIG. 8) proceeds to operation 808 where the first BSI wafer 910*a* is thinned down. Referring to FIG. 9C, a thinning process similar to the thinning process in operation 508 (FIG. 5) is applied to thin down the BSI wafer substrate 911*a* from its back side surface 906*a* to a thickness 915*a*, which may be on the order of a few microns (μm). In some embodiments, the thickness 915*a* is greater than about 1 μm but less than about 5 μm. The particular thicknesses disclosed in the present disclosure are mere examples and other thicknesses may be implemented depending on the type of application and design of the integrated camera module to be fabricated.

Figure 9D:
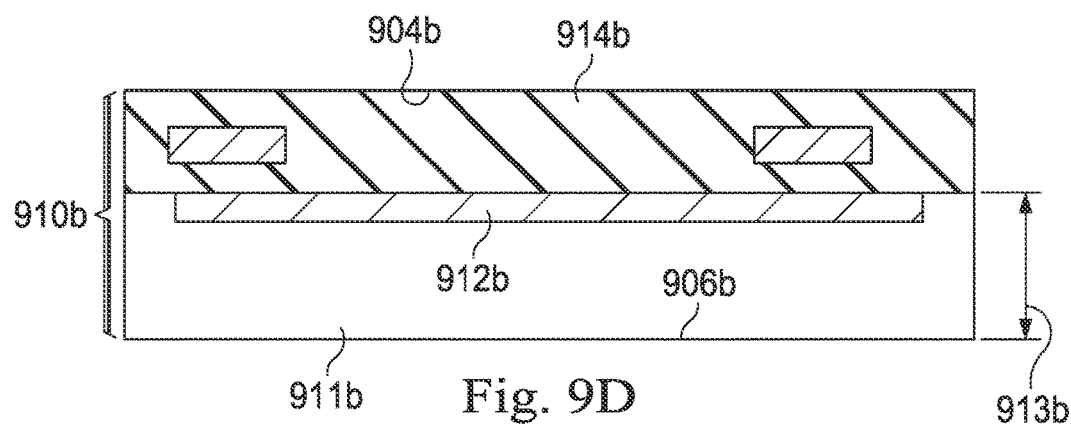

The process flow 800 (FIG. 8) proceeds to operation 812 where a second BSI wafer 910*b* is received. Referring to FIG. 9D, the second BSI wafer 610*b* includes a substrate 911*b* and a metal stack 914*b* formed over the substrate 911*b*.

The substrate 911b has a thickness 913b and includes a PD region 912b. The BSI wafer 910b has two surfaces, 904b and 906b. The surface 904b is at a front side of the metal stack 914b and the surface 906b is at a back side of the substrate 911b. The surface 904b includes a material which is about the same as the material of the surface 946. The BSI wafers 910a and 910b may contain the same or a different number of imaging pixels.

Figure 9E:
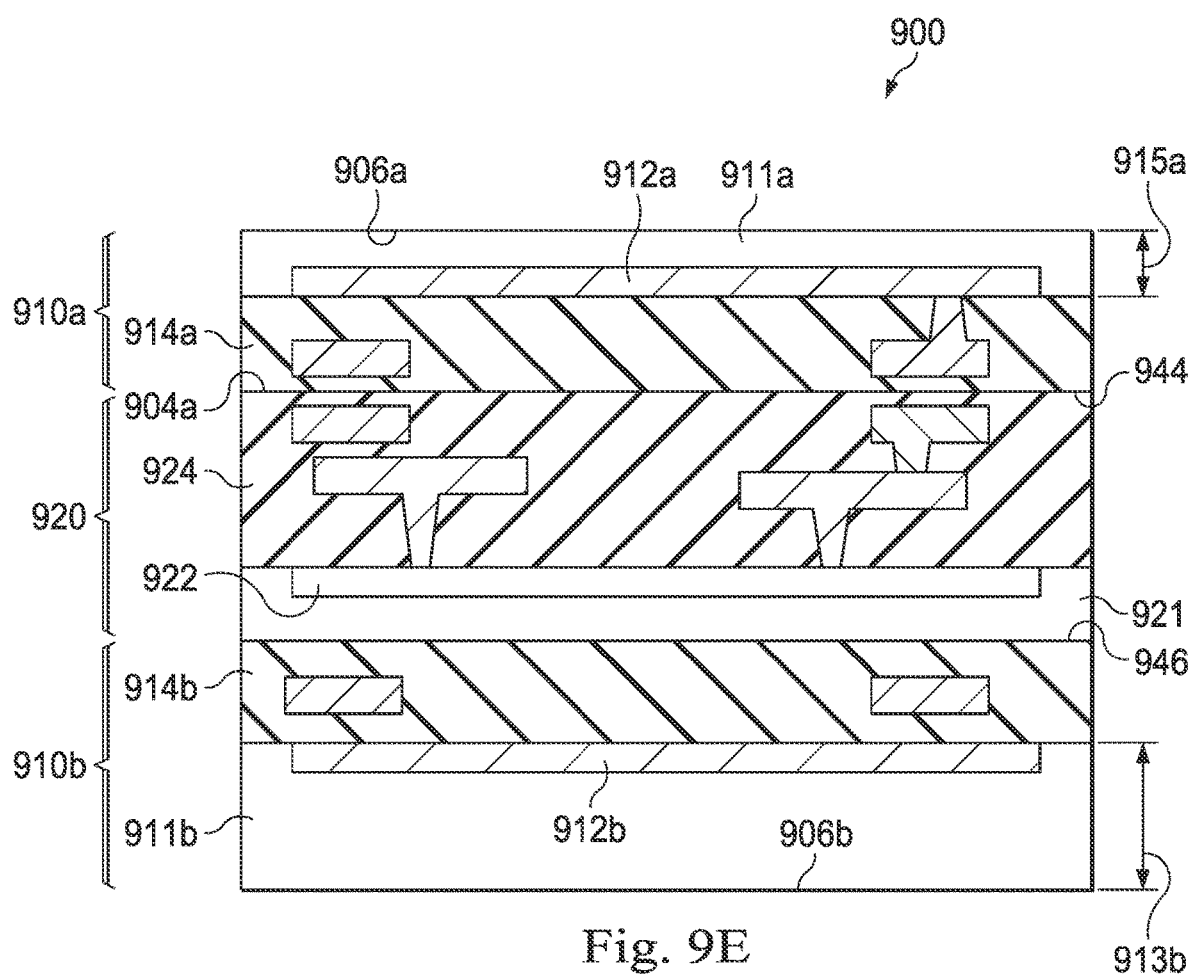

The process flow 800 (FIG. 8) proceeds to operation 814 where the second BSI wafer 910b is aligned and bonded with the processor wafer 920 using a fusion bond process. Referring to FIG. 9E, the surface 946 is directly bonded with the surface 904b. The fusion bond process in this operation is similar to the fusion bond process in operation 514 (FIG. 5).

Figure 9F:
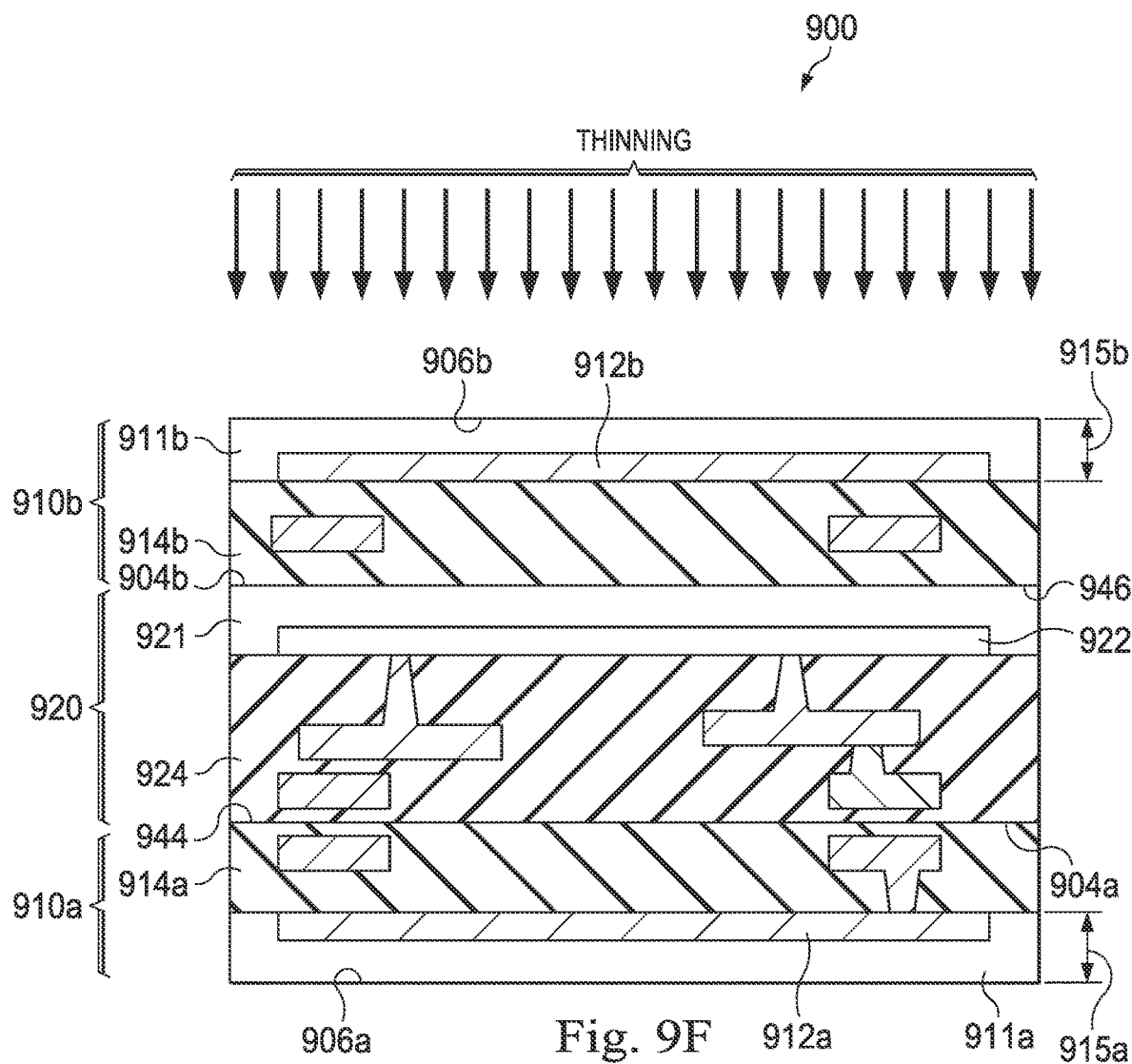

The process flow 800 (FIG. 8) proceeds to operation 816 where the second BSI wafer 910b is thinned down. Referring to FIG. 9F, a thinning process is applied to thin down the BSI wafer substrate 911b from its back side surface 906b. The thinning process in this operation is similar to the thinning process in operation 516 (FIG. 5). The substrate 911b is thinned to a thickness 915b, which may be on the order of a few microns ($\mu$m). In some embodiments, the thickness 915b is greater than about 1 $\mu$m but less than about 5 $\mu$m. The thickness 915b may be similar to or different from the thickness 915a depending on the type of application and design requirements of the integrated camera module to be fabricated.

The process flow 800 (FIG. 8) proceeds to operation 818 where conductive pads and thru-layer and/or thru-silicon vias are formed to electrically couple both the BSI wafers 910a and 910b to the processor wafer 920. FIG. 9G illustrates that the wafers 910a, 910b and 920 are etched. FIG. 9H illustrates that conductive features 962, 964, 966, 972, 974 and 976 are formed to couple the metal stacks in the three wafers. The processes of etching the wafers and forming the conductive features are similar to those in operation 518 (FIG. 5).

The process flow 800 (FIG. 8) proceeds to operation 820 to complete the integrated camera module. Operation 820 may include forming color filters and lens over both sides of the assembly 900; installing glass covers over the color filters and lens; and so on.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to a device including a first BSI image sensor, a second BSI image sensor, and a third element. The first BSI image sensor includes a first substrate and a first metal stack disposed over a first side of the first substrate. The first substrate includes a photodiode region for accumulating an image charge in response to radiation incident upon a second side of the first substrate. The first metal stack is operatively coupled to the first substrate for receiving image data from the first substrate. The first metal stack includes a first material layer at a first side of the first metal stack. The second BSI image sensor includes a second substrate and a second metal stack disposed over a first side of the second substrate. The second substrate includes a photodiode region for accumulating an image charge in response to radiation incident upon a second side of the second substrate. The second metal stack is operatively coupled to the second substrate for receiving image data from the second substrate. The second metal stack includes a second material layer at a first side of the second metal stack. The third element includes a third substrate and a third metal stack disposed over a first side of the third substrate. The third substrate includes an active region. The third metal stack includes a third material layer at a first side of the third metal stack. The first side of the first metal stack is bonded to the first side of the third metal stack and the first metal stack is electrically coupled to the third metal stack. The first side of the second metal stack is bonded to a second side of the third substrate and the second metal stack is electrically coupled to the third metal stack.

In another exemplary aspect, the present disclosure is directed to a method for fabricating a dual facing BSI image sensor assembly. The method includes receiving a first BSI image sensor element, a second BSI image sensor element, and a third element. The first BSI image sensor element includes a first substrate and a first metal stack formed over a first side of the first substrate. The first substrate includes a photodiode region for sensing radiation incident upon a second side of the first substrate. A first side of the first metal stack includes a first plurality of conductive features. The second BSI image sensor element includes a second substrate and a second metal stack formed over a first side of the second substrate. The second substrate includes a photodiode region for sensing radiation incident upon a second side of the second substrate. A first side of the second metal stack includes a second plurality of conductive features. The third element includes a third substrate and a third metal stack formed over a first side of the third substrate. A first side of the third metal stack includes a third plurality of conductive features. The method further includes bonding the first side of the first metal stack to the first side of the third metal stack using a first hybrid bond process and thinning the first substrate from the second side of the first substrate to a first thickness. The method further includes forming a passivation layer over a second side of the third substrate, wherein a first side of the passivation layer includes a fourth plurality of conductive features that is electrically coupled to the third metal stack. The method further includes bonding the first side of the second metal stack to the first side of the passivation layer using a second hybrid bond process and thinning the second substrate from the second side of the second substrate to a second thickness.

In another exemplary aspect, the present disclosure is directed to a method for fabricating an integrated camera module having dual facing BSI image sensors. The method includes receiving a first BSI image sensor element, a second BSI image sensor element, and a third element. The first BSI image sensor element includes a first substrate and a first metal stack formed over a first side of the first substrate. The first substrate includes a photodiode region for sensing radiation incident upon a second side of the first substrate. The second BSI image sensor element includes a second substrate and a second metal stack formed over a first side of the second substrate. The second substrate includes a photodiode region for sensing radiation incident upon a second side of the second substrate. The third element includes a third substrate and a third metal stack formed over a first side of the third substrate. The method further includes bonding a first side of the first metal stack to a first side of the third metal stack and thinning the first substrate from the second side of the first substrate to a first thickness. The method further includes bonding a first side of the second metal stack to a second side of the third substrate layer using a first fusion bond process; thinning the second substrate from the second side of the second substrate to a second thickness; and forming conductive features over the second side of the second substrate, wherein the conductive features electrically couple the second metal stack to the third metal stack.

What is claimed is:

1. A device comprising:
a first image sensor element having a first surface that includes a first conductive portion and a first dielectric portion;
a second image sensor element having a photosensitive region and a second surface that includes a second dielectric portion;
a processing element disposed between the first and second image sensors, the processing element having a third surface that includes a second conductive portion and a third dielectric portion and a fourth surface that include a fourth dielectric portion, wherein the second conductive portion directly interfaces with the first conductive portion, the third dielectric portion directly interfaces with first dielectric portion and the fourth dielectric portion directly interfaces with the second dielectric portion; and
a first conductive feature extending from the photosensitive region to the processing element.

2. The device of claim 1, wherein the first conductive feature includes a conductive pad and a via.

3. The device of claim 1, wherein a first portion of the photosensitive region is disposed on a first side of the first conductive feature and a second portion of the photosensitive region is disposed on a second side of the first conductive features, wherein the first side is opposite the second side.

4. The device of claim 1, wherein the third surface that includes the second conductive portion and the third dielectric portion are part of an interconnect structure and the fourth surface that include the fourth dielectric portion is part of a substrate, and
wherein the first conductive feature extends through the substrate and into the interconnect structure.

5. The device of claim 4, wherein an active region is disposed on the substrate and the first conductive feature extends through the active region.

6. The device of claim 1, wherein the third surface that includes the second conductive portion and the third dielectric portion are part of a redistribution layer.

7. The device of claim 1, further comprising a second conductive feature extending from the photosensitive region to the processing element.

8. A device comprising:
a first image sensor element having a first photosensitive region and a first surface that includes a first dielectric portion;
a second image sensor element having a second photosensitive region and a second surface that includes a second dielectric portion;
an interconnect structure disposed on a substrate between the first and second image sensor elements, the interconnect structure including a third surface that includes a third dielectric portion and the substrate having a fourth surface that includes a fourth dielectric portion, the third dielectric portion directly interfacing with the first dielectric portion and the fourth dielectric portion directly interfacing with the second dielectric portion; and
a first conductive feature extending from one of the first and second photodiode regions to the interconnect structure.

9. The device of claim 8, wherein the first and third dielectric portions are formed of the same material.

10. The device of claim 8, wherein the first photosensitive region includes a first number of pixels and the second photosensitive region includes a second number of pixels, the second number of pixels being different than the first number of pixels.

11. The device of claim 8, further comprising a second conductive feature extending from the second photodiode region to the interconnect structure, and
wherein the first conductive feature extends from the first photodiode region to the interconnect structure.

12. The device of claim 11, wherein the interconnect structure includes a third conductive feature having a first side facing the first image sensor element and a second side facing the second image sensor image, and
wherein the first conductive feature directly interfaces with the first side of the third conductive feature and the second conductive feature directly interfaces with the second side of the third conductive feature.

13. The device of claim 8, wherein at least one of the first image sensor element and the second image sensor element is a back side illuminated image sensor element.

14. The device of claim 8, wherein the substrate further includes an active region, and
wherein the first conductive feature extends through the active region.

15. A device comprising:
a first image sensor, wherein the first image sensor includes a first conductive portion and a first dielectric portion;
a second image sensor, wherein the second image sensor includes a second conductive portion and a second dielectric portion; and
a third element disposed between the first image sensor and the second image sensor, the third element having a first surface and a second surface, the first surface including a third conductive portion and a third dielectric portion and the second surface including a fourth conductive portion and a fourth dielectric portion, wherein the third conductive portion directly interfaces with the first conductive portion and the fourth conductive portion directly interfaces with the second conductive portion, wherein the third dielectric portion directly interfaces with first dielectric portion and the fourth dielectric portion directly interfaces with the second dielectric portion.

16. The device of claim 15, wherein the fourth dielectric portion is part of passivation layer, and
wherein the fourth conductive portion is at least partially embedded within the passivation layer.

17. The device of claim 15, wherein the first image sensor includes a first photosensitive region that is electrically coupled to the third conductive portion via the first conductive portion.

18. The device of claim 15, wherein the first conductive portion and the first dielectric portion are part of a first interconnect structure, and wherein the second conductive portion and the second dielectric portion are part of a second interconnect structure.

19. The device of claim 15, wherein the first and third conductive portions are formed of the same material and the first and third dielectric portions are formed of the same material.

20. The device of claim 15, wherein the third element further includes:
- a semiconductor substrate; and
- an interconnect structure disposed on a first side of the semiconductor substrate, wherein the first surface including the third conductive portion and the third dielectric portion are part of the interconnect structure, and
- wherein the fourth conductive portion and the fourth dielectric portion are disposed on a second side of the semiconductor substrate, the second side being different than the first side, and
- wherein a conductive via extends from the fourth conductive portion and through the semiconductor substrate to the interconnect structure to electrically couple the fourth conductive portion to the interconnect structure.

* * * * *